US009929181B2

(12) United States Patent
Kautzsch et al.

(10) Patent No.: US 9,929,181 B2
(45) Date of Patent: Mar. 27, 2018

(54) METHOD FOR MANUFACTURING AN ELECTRONIC DEVICE AND METHOD FOR OPERATING AN ELECTRONIC DEVICE

(71) Applicant: Infineon Technologies Dresden GmbH, Dresden (DE)

(72) Inventors: Thoralf Kautzsch, Dresden (DE); Alessia Scire, Dresden (DE); Steffen Bieselt, Wehlen (DE); Franz Hirler, Isen (DE); Anton Mauder, Kolbermoor (DE); Wolfgang Scholz, Olching (DE); Hans-Joachim Schulze, Taufkirchen (DE); Francisco Javier Santos Rodriguez, Villach (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 15/375,277

(22) Filed: Dec. 12, 2016

(65) Prior Publication Data

US 2017/0092659 A1 Mar. 30, 2017

Related U.S. Application Data

(62) Division of application No. 14/098,591, filed on Dec. 6, 2013, now Pat. No. 9,560,765.

(51) Int. Cl.
*H01L 21/76* (2006.01)
*H01L 27/12* (2006.01)
(Continued)

(52) U.S. Cl.
CPC .... *H01L 27/1207* (2013.01); *H01L 21/76283* (2013.01); *H01L 21/76895* (2013.01);
(Continued)

(58) Field of Classification Search
CPC ......... H01L 21/02; H01L 21/20; H01L 21/28; H01L 21/31; H01L 21/70; H01L 21/76;
(Continued)

(56) References Cited

U.S. PATENT DOCUMENTS 5,198,390 A 3/1993 MacDonald et al.
5,227,658 A * 7/1993 Beyer .................. H01L 21/764
257/508

(Continued)

FOREIGN PATENT DOCUMENTS

CN  1156888 C   7/2004
CN  1225028 C  10/2005
(Continued)

*Primary Examiner* — Xiaoliang Chen
(74) *Attorney, Agent, or Firm* — Viering, Jentschura & Partner mbB

(57) ABSTRACT

According to various embodiments, an electronic device may include a carrier including at least a first region and a second region being laterally adjacent to each other; an electrically insulating structure arranged in the first region of the carrier, wherein the second region of the carrier is free of the electrically insulating structure; a first electronic component arranged in the first region of the carrier over the electrically insulating structure; a second electronic component arranged in the second region of the carrier; wherein the electrically insulating structure includes one or more hollow chambers, wherein the sidewalls of the one or more hollow chambers are covered with an electrically insulating material.

5 Claims, 18 Drawing Sheets

(51) Int. Cl.
  *H01L 21/768* (2006.01)
  *H01L 21/8234* (2006.01)
  *H01L 21/762* (2006.01)
  *H01L 29/78* (2006.01)
  *H01L 29/739* (2006.01)

(52) U.S. Cl.
  CPC .. *H01L 21/823487* (2013.01); *H01L 29/7397* (2013.01); *H01L 29/7813* (2013.01)

(58) Field of Classification Search
  CPC ....... H01L 21/762; H01L 29/06; H01L 29/76; H01L 29/78; H01L 29/84
  USPC ........ 361/761; 257/302, 315, 330, 331, 347, 257/417, 506, 522; 438/156, 424
  See application file for complete search history.

(56) References Cited

U.S. PATENT DOCUMENTS

| | | | |
|---|---|---|---|
| 5,365,097 A * | 11/1994 | Kenney | H01L 29/78642 257/302 |
| 5,641,694 A * | 6/1997 | Kenney | H01L 27/10841 257/E21.131 |
| 5,972,758 A | 10/1999 | Liang | |
| 6,433,401 B1 | 8/2002 | Clark et al. | |
| 6,888,213 B2 | 5/2005 | Leonardi et al. | |
| 6,936,491 B2 | 8/2005 | Partridge et al. | |
| 7,019,364 B1 * | 3/2006 | Sato | B82Y 20/00 257/347 |
| 8,481,400 B2 | 7/2013 | Kautzsch et al. | |
| 2003/0151112 A1 | 8/2003 | Yamada et al. | |
| 2004/0026761 A1 * | 2/2004 | Leonardi | H01L 21/76264 257/506 |
| 2005/0029501 A1 | 2/2005 | Geusic et al. | |
| 2006/0131651 A1 * | 6/2006 | Sato | B82Y 20/00 257/347 |
| 2006/0138541 A1 | 6/2006 | Nakamura et al. | |
| 2006/0194410 A1 * | 8/2006 | Sugaya | H01L 21/76286 438/424 |
| 2007/0085131 A1 * | 4/2007 | Matsuo | H01L 29/0657 257/315 |
| 2010/0078757 A1 * | 4/2010 | Eun | H01L 21/76232 257/506 |
| 2010/0207206 A1 | 8/2010 | Krischke et al. | |
| 2011/0133186 A1 | 6/2011 | Barlocchi et al. | |
| 2011/0136302 A1 | 6/2011 | Yamazaki et al. | |
| 2012/0068277 A1 | 3/2012 | Kautzsch et al. | |
| 2012/0146133 A1 * | 6/2012 | Hirler | H01L 21/76898 257/330 |
| 2013/0001682 A1 * | 1/2013 | Tang | H01L 21/84 257/331 |
| 2013/0020718 A1 | 1/2013 | Chou | |
| 2013/0062502 A1 * | 3/2013 | Kautzsch | H01L 31/062 250/206 |
| 2013/0134530 A1 * | 5/2013 | Kautzsch | B81C 1/00158 257/417 |
| 2013/0256800 A1 | 10/2013 | Qiao et al. | |

FOREIGN PATENT DOCUMENTS

| | | |
|---|---|---|
| CN | 102097441 A | 6/2011 |
| CN | 102408092 A | 4/2012 |
| CN | 102640272 A | 8/2012 |
| CN | 103022006 A | 4/2013 |
| WO | 2013068169 A2 | 5/2013 |

* cited by examiner

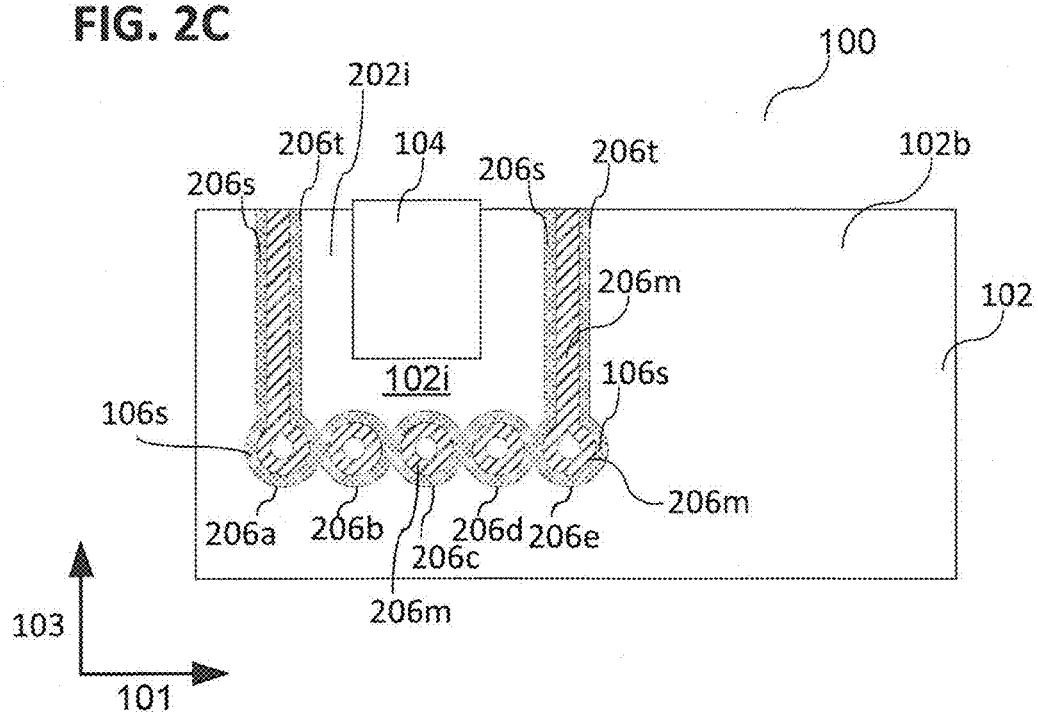
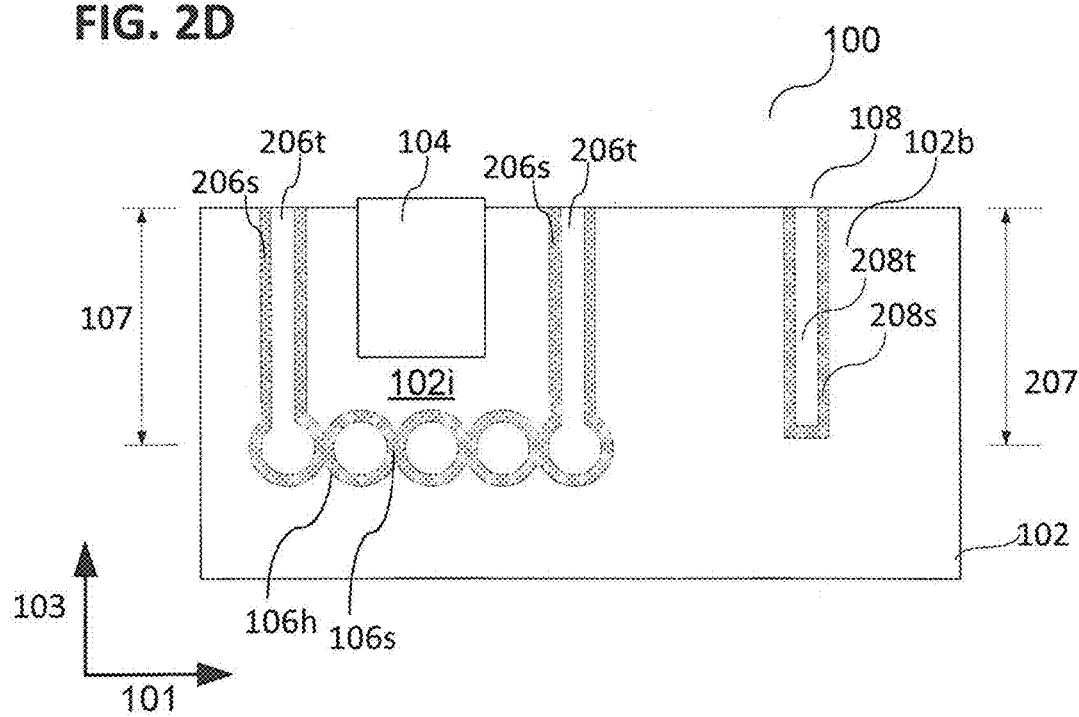

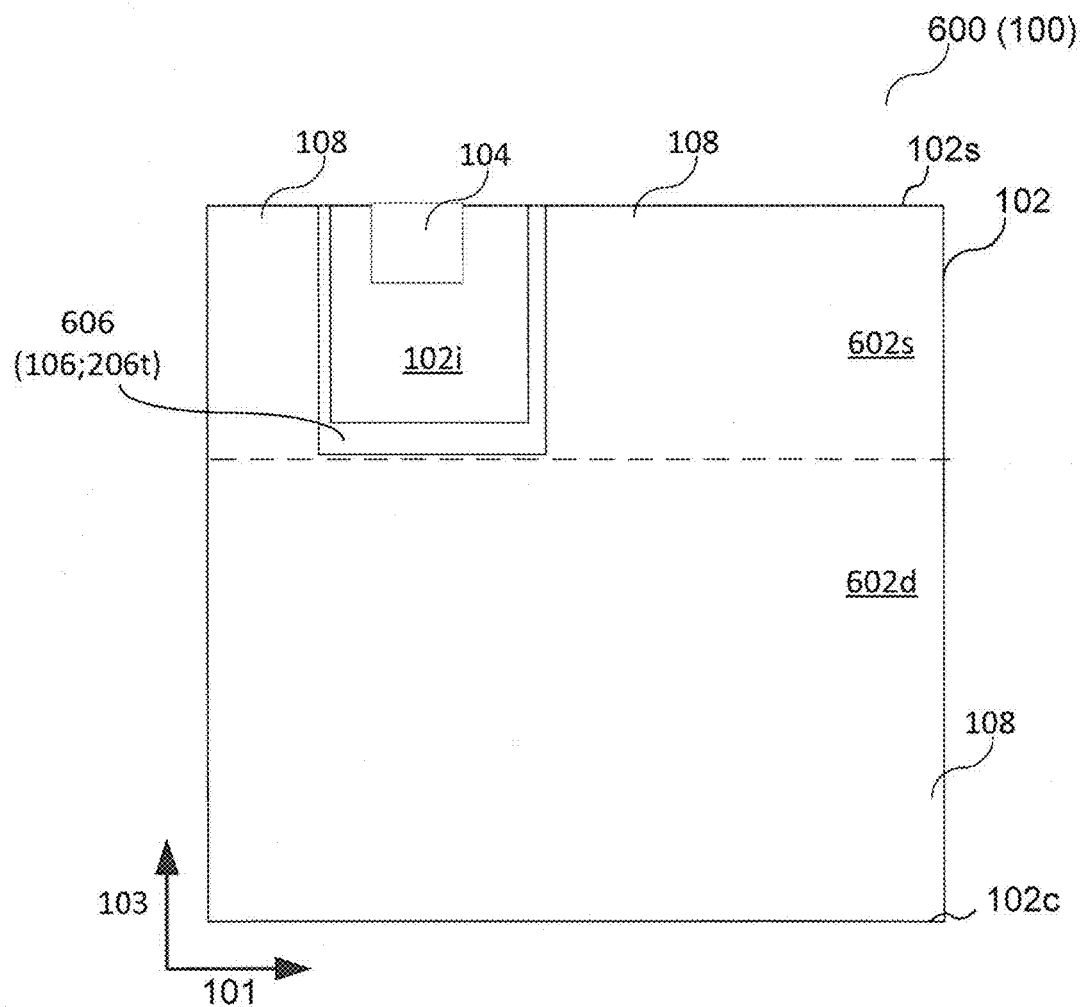

METHOD FOR MANUFACTURING AN ELECTRONIC DEVICE AND METHOD FOR OPERATING AN ELECTRONIC DEVICE

RELATED APPLICATION(S)

This application is a divisional of U.S. patent application Ser. No. 14/098,591, filed Dec. 6, 2013, which is incorporated herein by reference in its entirety.

TECHNICAL FIELD

Various embodiments relate generally to an electronic device, a method for manufacturing an electronic device, and a method for operating an electronic device.

BACKGROUND

In general, a power electronic device, such as a diode, a bipolar junction transistor, an insulated gate bipolar transistor, or a power metal oxide semiconductor field-effect transistor (power MOSFET), may be operated at a high voltage, e.g. up to 1000 V or up to 5000 V, and a high current, e.g. up to 100 A or up to 5000 A. Therefore, an additional external electronic device may be necessary to control the power electronic device or to analyze the function of the power electronic device, since for example a logic circuit, a switching circuit, or a measurement circuit (e.g. temperature sensor) may not withstand the high voltages and/or the high currents typically operated by a power electronic device.

SUMMARY

According to various embodiments, an electronic device may include a carrier including at least a first region and a second region being laterally adjacent to each other; an electrically insulating structure arranged in the first region of the carrier, wherein the second region of the carrier is free of the electrically insulating structure; a first electronic component arranged in the first region of the carrier over the electrically insulating structure; a second electronic component arranged in the second region of the carrier; wherein the electrically insulating structure includes one or more hollow chambers, wherein the sidewalls of the one or more hollow chambers are covered with an electrically insulating material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A to 2F show respectively a schematic view of an electronic device, according to various embodiments;

FIGS. 6A to 6D show respectively a schematic view of an electronic device, according to various embodiments;

DESCRIPTION

Figure 1A:
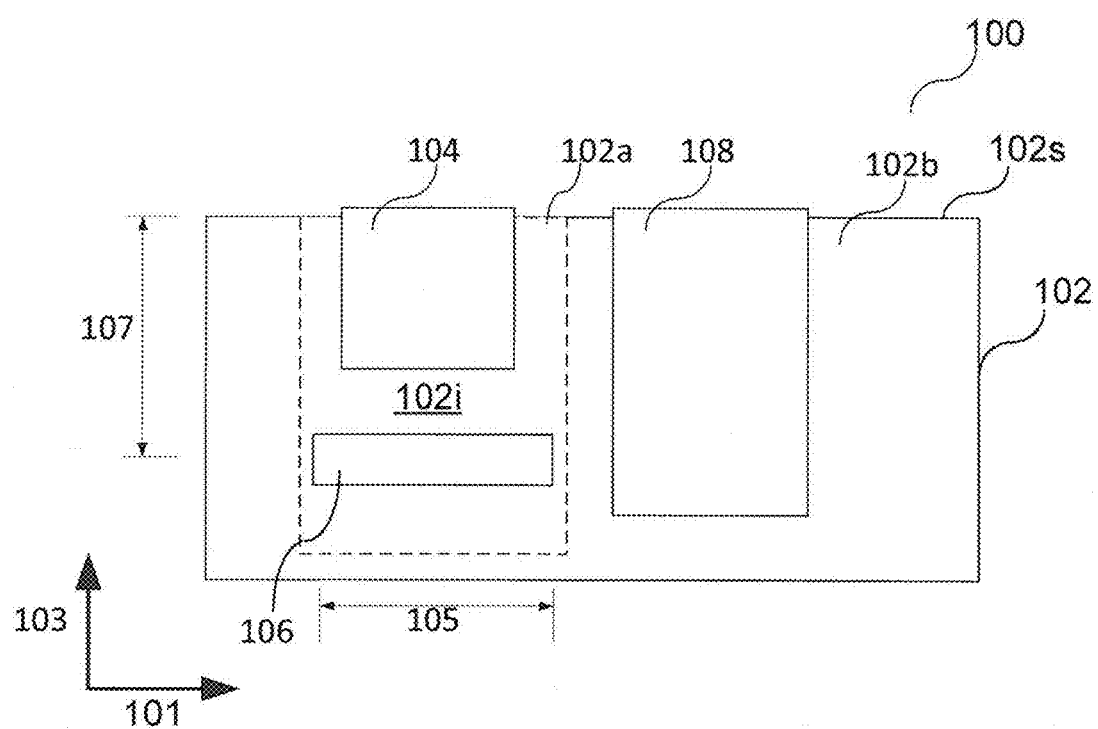
FIG. 1A shows a schematic view of an electronic device including an electrically insulating structure, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface or deposit a layer "over" a carrier, may be used herein to mean that the deposited material may be formed "directly on", e.g. in direct contact with, the implied side, surface, or carrier. The word "over" used with regards to a deposited material formed "over" a side or surface or to deposit a layer "over" a carrier, may be used herein to mean that the deposited material may be formed "indirectly on" the implied side, surface, or carrier with one or more additional layers being arranged between the implied side, surface, or carrier and the deposited material.

The term "lateral" used with regards to the "lateral" extension of a structure (or of a carrier), a lateral direction, or "laterally" adjacent, may be used herein to mean an extension along a direction parallel to a surface of a carrier or a direction parallel to a surface of a carrier. That means, a surface of a carrier (e.g. a surface of a substrate, or a surface of a wafer) may serve as reference, commonly referred to as the main processing surface of a carrier (or the main processing surface of another type of carrier). Further, the term "width" used with regards to a "width" of a structure (or of a structure element, e.g. a cavity) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). Further, the term "depth" used with regards to a depth of a recess (or of a structure element), may be used herein to mean an extension of a recess along a direction perpendicular to the surface of a carrier (e.g. perpendicular to the main processing surface of a carrier). Further, a "vertical" structure may be referred to as a structure extending in a direction perpendicular to the lateral direction (e.g. perpendicular to the main processing surface of a carrier) and a "vertical" extension may be referred to as an extension along a direction perpendicular to the lateral direction (e.g. an extension perpendicular to the main processing surface of a carrier).

The word "cover" used with regards to deposited material covering a structure (or a structure element), may be used herein to mean that a deposited material may cover a structure (or a structure element) completely, e.g. covering all exposed sides and surfaces of a structure. The word "cover" used with regards to deposited material covering a structure (or a structure element), may be used herein to mean that the deposited material may cover a structure at least partially, e.g. a material may at least partially cover the exposed sides and surfaces of a structure.

According to various embodiments, a hollow chamber may for example be also filled with a material, e.g. a hollow chamber in a silicon wafer may be filled or partially filled with silicon oxide. Therefore, the term "hollow" used with regards to a "hollow" chamber may be used herein to mean that the hollow chamber itself (e.g. a cavity, e.g. a void, e.g. a hollow structure) may be free of material. However, a hollow chamber may be partially filled with a filling material, or may be completely filled with a filling material. Referring to this, the hollow chamber may be partially filled or completely filled with another material than the material providing the hollow chamber.

According to various embodiments, forming a layer (e.g. depositing a layer, depositing a material, and/or applying a layering process) as described herein may also include forming a layer, wherein the layer may include various sub-layers, whereby different sub-layers may include different materials respectively. In other words, various different sub-layers may be included in a layer, or various different regions may be included in a deposited layer and/or in a deposited material.

According to various embodiments, a method for processing a carrier (e.g. a method for forming one or more hollow chambers or hollow structures in a carrier) or a method for manufacturing an electronic device, as described herein, may include several basic semiconductor manufacturing techniques which may be used at least once in the overall manufacturing process or at least once in at least once during processing of a carrier. The following description of basic techniques should be understood as illustrating examples, which techniques may be included in the processes described herein. The exemplarily described basic techniques may be not necessarily need to be construed as preferred or advantageous over other techniques or methods, since they only serve to illustrate how one or more embodiments of the invention may be practiced. For sake of brevity, the illustration of exemplarily described basic techniques may be only a short overview and should not be considered as exhaustive specification.

According to various embodiments, a layering process (or layering) may be included in a method for processing a carrier, in a method for manufacturing an electronic device, or in another process or method, as described herein. In a layering process, a layer may be deposited over a surface (e.g. over a carrier, over a wafer, over a substrate, over another layer, or the like) using deposition techniques, which may include chemical vapor deposition (CVD, or a CVD process) and physical vapor deposition (PVD, or a PVD process), according to various embodiments (a layering process may therefore include depositing a material). According to various embodiments, the thickness of a deposited layer may be in the range of a few nanometers up to several micrometers depending on its specific function. Further, according to various embodiments, a layer may include at least one of an electrically insulating material, an electrically semiconducting material, and an electrically conductive material, depending on the respective specific function of the layer. According to various embodiments, modifications of PVD and CVD processes may be used in the method for processing a carrier, e.g. for depositing an electrically insulating layer or filling a hollow structure with an electrically conductive material.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer deposition (ALD), atomic layer CVD (ALCVD), vapor phase epitaxy (VPE), metal organic CVD (MOCVD), hybrid physical CVD (HPCVD), and the like. According to various embodiments, a layering process may further include forming a resist layer or depositing a resist layer, e.g. using spin coating, spray coating, and the like.

According to various embodiments, a patterning process (or patterning) may be included in a method for processing a carrier, in a method for manufacturing an electronic device, or in another process or method, as described herein. The patterning process may include for example removing selected portions of a surface layer and/or removing selected portions of a material. According to various embodiments, a plurality of trenches, recesses and/or holes may be formed in a carrier or in a surface layer of a carrier using a patterning process. Further, patterning a layer may be used to form a patterned layer, e.g. a mask layer. Since a plurality of processes may be involved, according to various embodiments, there are various possibilities to perform a patterning process, wherein aspects may be: selecting at least one portion of a surface layer (or of a material or of a carrier) which shall be removed, e.g. using at least one lithographic process; and removing the selected portions of a surface layer, e.g. using at least one etch process.

According to various embodiments, a variety of lithographic processes may be applied to generate a mask layer (e.g. a patterned resist layer), for example photolithography, microlithography or nanolithography, electron beam lithography, X ray lithography, ultraviolet lithography, extreme ultraviolet lithography, interference lithography, and the like. A lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

According to various embodiments, an initial cleaning process or a cleaning process, which may be included in a lithographic process, may be applied to remove organic or inorganic contaminations from a surface (e.g. from a surface layer, from a carrier, from a wafer, and the like) by for example wet chemical treatment. According to various embodiments, a cleaning process (e.g. chemical mechanical polishing (CMP)) may also be applied to remove an oxide layer (e.g. a thin silicon oxide layer) from a surface (e.g. from a surface layer, from a carrier, or from a wafer, and the like).

According to various embodiments, a resist may be applied to cover a surface (e.g. a surface layer, a carrier, or a wafer, and the like). According to various embodiments, applying a resist may include spin coating or spray coating to generate a resist layer. According to various embodiments, a resist may be exposed (e.g. by exposing a resist to a pattern of light) to transfer a desired pattern to a resist, e.g. using light or electrons, wherein the desired pattern may be defined by a patterned lithographic mask (e.g. a glass carrier with a patterned chromium layer used for exposing the resist layer).

According to various embodiments, a lithographic process may include developing a resist (e.g. developing a photoresist using a photoresist developer) to partially remove the resist to generate a patterned resist layer (e.g. on a surface layer or on a carrier, a wafer, and the like). According to various embodiments, the developing process may include a special chemical solution (a so called developer) as for example sodium hydroxide or tetramethylammonium hydroxide (TMAH, a metal ion free developer). According to various embodiments, the patterned resist layer may be solidified in a hard bake process (a heat treatment, e.g. rapid thermal processing), realizing a more durable protecting layer for later processes.

Independently of the described lithographic processes, a resist layer or a patterned resist layer may be removed completely (or partially) at a desired processing stage (e.g. after a trench has been etched or a carrier has been patterned) in a so called resist strip process. According to various embodiments, a resist may be removed chemically and/or by using oxygen plasma.

It should be noted, that a lithographic process, including for example exposing a resist and developing a resist may also be considered as a patterning process, wherein a patterned resist layer (a soft mask, or a resist mask) may be generated by the lithographic process. Further, according to various embodiments, subsequently using an etch process a pattern can be transferred from a patterned resist layer to a prior deposited or grown layer, wherein the previously deposited or grown layer may include a hard mask material as for example an oxide or a nitride (e.g. silicon oxide, e.g. silicon nitride) creating a so-called hard mask.

According to various embodiments, an etch process, which may be included in a patterning process, may be applied to remove material from a prior deposited layer, a grown surface layer, or from a carrier (or substrate, or wafer), and the like. According to various embodiments, a patterned layer of a hard mask material may serve as a mask for processes like etching or forming recesses, trenches, or holes at desired positions into a carrier or into a surface layer. Further, according to various embodiments, a patterned photoresist may also serve as a mask (a so called soft mask). The mask material may usually be selected with regard to specific needs as for example chemical stability or mechanical stability, e.g. to protect regions from being etched, or to define the shape of structure elements to be generated during a layering process, and the like.

According to various embodiments, some processes during manufacture of an electronic device or during processing a carrier may require a conformally deposited layer or may require conformally depositing a layer (e.g. for forming a layer over a sidewall of a structure element or covering an inner sidewall or surface of a cavity), which means that a layer (or a material forming a layer) may exhibit only small thickness variations along an interface with another body, e.g. a layer may exhibit only small thickness variations along edges, steps or other elements of the morphology of the interface. According to various embodiments, layering processes such as plating, atomic layer deposition (ALD), or several CVD processes (e.g. ALCVD, or LPCVD) may be suitable to generate a conformal layer or a conformally deposited layer of a material. According to various embodiments, using for example an atomic layer deposition (ALD) process, a structure having a high aspect ratio (e.g. larger than 5, e.g. larger than 10, e.g. larger than 20) may be conformally covered with a layer or thin film. Further, according to various embodiments, using for example an atomic layer deposition (ALD) process, the inner sidewall of a cavity or of a hollow chamber may be covered (completely or partially) with a conformal layer or a conformal thin film. In other words, using atomic layer deposition may allow coating the inner sidewall of a cavity or a cavity structure with a material layer (e.g. with a conformal material layer), if the cavity or the cavity structure may have at least one opening such that the material forming the material layer may reach the interior of the cavity or the cavity structure. Further, using atomic layer deposition may allow filling a hollow chamber completely, if the hollow chamber may have at least one opening.

For several reasons, as described herein, it may be desired to integrate one or more sensitive electronic components into an electronic device, wherein a sensitive electronic component (e.g. a sensor, a switch, a logic circuit, a microprocessor, and the like) may be not readily able to withstand the respective operating conditions of the electronic device (e.g. a semiconductor power device, an IGBT, a power MOSFET, and the like). The sensitive electronic component may work for example in a voltage range and/or a current range being at least one order of magnitude lower than a current and/or a voltage being operated by the electronic device. Illustratively, it may be desired to provide a first electronic component and a second electronic component in a single carrier or in a single semiconductor substrate, wherein the two electronic components may need different operating conditions (e.g. operating voltages, operating currents, and the like), e.g. it may be desired integrating a sensor (e.g. a temperature sensor) into a power electronic device to provide a direct measurement of the actual state of the power electronic device, integrating a current and/or voltage measurement structure into a power electronic device to determine the electronic properties of the power electronic device more accurately, and/or integrating a switch structure or a control circuit (e.g. a logic circuit) into a power electronic device to control the operation of the power electronic device.

According to various embodiments, as described in the following, an electronic device may be provided including at least a first electronic component (e.g. a sensor, a logic circuit, a switching circuit, a control circuit, and/or a measurement circuit) and a second electronic component (e.g. a power electronic component, such as a diode, a bipolar junction transistor, an insulated gate bipolar transistor (IGBT), a power MOSFET (a power metal oxide semiconductor (MOS) field-effect transistor (FET)), a thyristor, a gate turn-off thyristor, a MOS-controlled thyristor, an integrated gate-commutated thyristor (IGCT), and the like). According to various embodiments, the second electronic component may be configured to operate at other operating conditions than the first electronic component, e.g. in a different voltage range and/or in a different current range. According to various embodiments, the second electronic component may be a semiconductor power component operating in a voltage range and/or current range being one or more orders of magnitude larger than the operating conditions of the first electronic component, e.g. the second electronic component may operate voltages in a range from about 50 V to about 5000 V and/or currents in the range from about 0.5 A to about 5000 A, wherein the first electronic component may be a logic circuit or a sensor working at voltages lower than about 50 V and/or currents lower than about 50 A. The first electronic component may be a control circuit for a second electronic component, e.g. for a power switch (e.g. a power transistor), wherein the control circuit for large power switches may be operated at currents (e.g. pulsed switching currents) up to 30 A. Further, if the power switch may work for example at a voltage of about 600 V with a current of about 1 A, the control circuit for such a power switch may be for example operated at currents smaller than about 0.5 A. The first electronic component (e.g. a logic circuit, a switching circuit, a measurement circuit, and/or a temperature sensor) may not readily withstand voltages and/or currents typically operated by a power electronic component, wherein the first electronic component and the first electronic component may be arranged adjacent to each other in a single carrier, therefore, according to various embodiments, the first electronic component may be separated from the second electronic component via an electrically insulating structure being arranged in the carrier.

Further, according to various embodiments, the first electronic component may be electrically coupled to the second electronic component in order to analyze and/or control the second electronic component, e.g. via a metallization structure arranged over the carrier, wherein the first electronic component and the second electronic component may be at least partially formed in the carrier.

Illustratively, another aspect of various embodiments may be to provide an electronic device including a first electronic component and a second electronic component in the same carrier (e.g. being adjacent to each other or e.g. the first electronic component may be surrounded by the second electronic component), wherein the first electronic component may be arranged over a buried electrically insulating structure, wherein the buried electrically insulating structure may include one or more cavities (hollow chambers) being at least partially filled with an electrically insulating material. For example, one or more cavities in a silicon wafer may be at least partially filled with silicon oxide; or one or more cavities may be formed or may be disposed in a silicon wafer, wherein the inner surfaces (or surface regions) of the one or more cavities are covered (or coated) with silicon oxide. Therefore, according to various embodiments, the part of the first electronic component being arranged in the carrier may be at least partially electrically separated from the part of the second electronic component being arranged within the carrier, such that a charge carrier transport from the first electronic component to the second electronic component may be prevented or reduced.

In other words, a carrier may be provided including at least one electrically insulating structure arranged in the carrier extending at least in a direction parallel to the surface of the carrier providing a separated region of the carrier between the electrically insulating structure and the surface of the carrier, wherein a first electronic component may be arranged in the separated region of the carrier, and another electronic component may be provided in the carrier outside the separated region of the carrier. Referring to this, the separated region of the carrier may be partially or completely separated (electronically and/or thermally separated) from the carrier.

According to various embodiments, the electronic device described in the following may include a carrier, e.g. a silicon wafer, having an upper surface (e.g. a main processing surface) and a bottom surface opposite to the upper surface of the carrier. According to various embodiments, the carrier may include at least one carrier region extending from the upper surface into the carrier, wherein the least one carrier region may be electrically conductively separated from the rest of the carrier via a dielectric material structure, wherein the dielectric material structure may have a lateral extension (parallel to the upper surface and/or parallel to the bottom surface of the carrier), e.g. the carrier may include a so-called silicon-on-insulator structure or a semiconductor-on-insulator structure, e.g. the carrier may include a so-called silicon-on-nothing structure. According to various embodiments, the lateral extension of the dielectric material structure may be laterally limited, e.g. the lateral extension of the dielectric material structure may be smaller than the width of the carrier, such that a second region in the carrier may be provided, wherein the second region may be free of the dielectric material structure, which may allow providing an electronic component in the second region of the carrier being configured to enable a charge carrier exchange (or transport) between the upper surface of the carrier and the bottom surface of the carrier (or between an upper electrode being arranged on the upper surface of the carrier and a bottom electrode being arranged on the bottom surface of the carrier). According to various embodiments, the second region of the carrier may include an electronic vertical component, e.g. a vertical transistor, a vertical transistor structure, and the like.

According to various embodiments, the electronic device described herein may include an isolated region in a carrier, wherein the isolated region may be provided via an electrically insulating structure, wherein the spatial extension of the electrically insulating structure may be laterally limited such that the carrier may include a region being free of the electrically insulating structure, wherein the region being free of the electrically insulating structure may be used for forming and/or providing a power electronic component, wherein a desired heat dissipation from the power electronic component to the carrier may not be affected by the electrically insulating structure, wherein the locally restricted isolated region may be used for forming and/or providing at least one of a control circuit, a measurement structure, a sensor, or a feedback structure for the power electronic component. Referring to this, since a control circuit, a measurement structure, a sensor, or a feedback structure may not produce a notable amount of heat, the thermally isolating properties of the electrically insulating structure may not to be considered; in contrast, the electrically isolating properties of the electrically insulating structure may improve the functions of the components arranged in the isolated region or may protect the components being arranged in the isolated region from high voltages and high currents being operated outside the isolated region.

Further, according to various embodiments, the electronic device, as described herein, may provide a compact (space saving) device including for example a control circuit being integrated into a power electronic component, wherein due to the integration the length of the signal lines may be short compared to a commonly used power electronic device having an external control circuit; as a result, according to various embodiments, an enhanced access to signals from the power electronic component may be possible or a faster determination and control of operating parameters of the power electronic component may be realized. Further, according to various embodiments, the electronic device, as described herein, may enable determining operating states of the power electronic component (e.g. determining a voltage drop over a channel, determining an electric potential in the power electronic component, determining temperatures in the power electronic component via a voltage signal) which may be not accessible with a commonly used external device.

According to various embodiments, the electronic device, as described herein, may provide an electronic control circuit being integrated into a power electronic component, the electronic control circuit may be configured to monitor and control the power electronic component such that the power electronic component may be designed according to other aspects, which may allow for example a smaller design obtaining the same properties as a common power electronic device and/or an enhanced functionality at the same size as a common power electronic device.

According to various embodiments, a carrier, as described herein, (e.g. a substrate, a wafer, and the like) may be made of semiconductor materials of various types, including silicon, germanium, Group III to V or other types, including polymers, for example, although in another embodiment, other suitable materials can also be used. In an embodiment, the wafer substrate is made of silicon (doped or undoped). As an alternative, any other suitable semiconductor materials can be used for the wafer substrate, for example semiconductor compound material such as silicon carbide (SiC), gallium arsenide (GaAs), gallium nitride (GaN), indium phosphide (InP), but also any suitable ternary semiconductor compound material or quaternary semiconductor compound material such as indium gallium arsenide (InGaAs). According to various embodiments, the carrier may include one or more doped regions, e.g. providing one or more p-n-junctions in the carrier.

FIG. 1A schematically illustrates an electronic device 100 including a carrier 102, a first electronic component 104 being arranged in a first region 102a of the carrier 102, an electrically insulating structure 106 being arranged in the first region 102a of the carrier 102 below the first electronic component 104, a second electronic component 108 being arranged outside the first region 102a of the carrier 102 (e.g. in a second region 102b of the carrier 102). According to various embodiments, the electrically insulating structure 106 may include one or more hollow chambers (cf. FIGS. 1B to 1D), wherein the sidewalls of the one or more hollow chambers may be covered with an electrically insulating material (or respectively the inner surface of each hollow chamber of the one or more hollow chambers may be covered with an electrically insulating material).

According to various embodiments, the electronic device 100 may at least include: a carrier 102 (or a substrate 102) including at least a first region 102a and a second region 102b being laterally adjacent to each other; an electrically insulating structure 106 arranged in the first region 102a of the carrier 102, wherein the second region 102b of the carrier is free of the electrically insulating structure 106; a first electronic component 104 arranged in the first region 102a of the carrier 102 over the electrically insulating structure 106; a second electronic component 108 arranged in the second region 102b of the carrier 102; wherein the electrically insulating structure 106 may include one or more hollow chambers, wherein the sidewalls of the one or more hollow chambers are covered with an electrically insulating material.

According to various embodiments, the one or more hollow chambers included in the electrically insulating structure 106 or forming the electrically insulating structure 106 may provide a laterally extended electrically insulating structure 106 in the carrier 102 (e.g. a buried electrically insulating structure 106), wherein the electrically insulating structure 106 may be generated locally in a desired depth 107 below the upper surface 102s of the carrier 102 and with a desired width 105. Using one or more hollow chambers (e.g. filled or at least partially filled with an oxide) as electrically insulating structure 106 may allow a simple and cheap design for an electronic device 100, having the properties and functionalities as described herein. According to various embodiments, depending on the thickness of the electrically insulating material layer covering the inner sidewalls of the one or more hollow chambers the electrical and thermal properties of the electrically insulating structure 106 may be adapted to provide desired electrical and/or thermal properties, wherein the thickness of the electrically insulating material layer covering the inner sidewalls of the one or more hollow chambers may be easily controlled during processing the carrier, as described later. Further, according to various embodiments, the thickness of the electrically insulating material layer covering the inner sidewalls of the one or more hollow chambers may be adapted to provide desired physical (electrical and thermal) properties of an isolated region 102i (or a partially isolated, e.g. a vertically isolated region 102i) of the carrier 102, the isolated region 102i may be arranged above the electrically insulating structure 106.

The carrier 102 may include silicon or the carrier 102 may be a silicon wafer. Further, according to various embodiments, the first electronic component 104 and the second electronic component 108 may include a part of the carrier 102, e.g. a part of the carrier 102 in the first region 102a may be used to provide the first electronic component 104, and a part of the carrier 102 in the second region 102b may be used to provide the second electronic component 108. Referring to this, the carrier may include one or more doped regions providing for example a basic structure of a transistor or a plurality of transistors, e.g. a channel, a junction, a drift region, a base, a depletion region, and the like.

According to various embodiments, the carrier 102 may include a layered design including one or more layers having a different doping level and/or a different kind of charge carriers (electrons or holes depending on the specific doping) such that the carrier may provide the basic structure of an electronic vertical component, e.g. a vertical transistor, a vertical MOSFET, a vertical IGBT, and the like. According to various embodiments, the electrically insulating structure 106 may prevent or may reduce a vertical current flow within the first region 102a of the carrier 102. According to various embodiments, the lateral extension 105 of the electrically insulating structure 106 may be limited such that the second region 102b of the carrier 102 may be free of the electrically insulating structure 106 such that a vertical current flow may be possible in the second region 102b of the carrier 102. In other words, the vertical current flow in the carrier outside the first region 102a of the carrier 102 may not be reduced or influence by the electrically insulating structure 106.

According to various embodiments, the electrically insulating structure 106 may include a buried electrically insulating structure 106 as shown for example in FIG. 1A. In other words, at least a part of the electrically insulating structure 106 may be a buried electrically insulating structure 106. According to various embodiments, the term "buried" may be used herein to mean that the electrically insulating structure 106 (or a buried part of the electrically insulating structure 106) may be arranged below the surface 102s of the carrier 102, wherein carrier material is arranged in an isolated region 102i between the electrically insulating structure 106 and the surface 102s of the carrier 102. In other words, a buried electrically insulating structure 106 may be arranged within the carrier 102 providing an isolated (e.g. vertically isolated) region 102*i* above the buried electrically insulating structure 106, wherein the isolated region 102*i* may include carrier material, e.g. silicon, e.g. doped silicon.

According to various embodiments, the lateral extension 105 (e.g. the width) of the electrically insulating structure 106 (or the buried part of the electrically insulating structure 106) may be in the range from about several hundreds of nanometers to about several millimeters, e.g. the width 105 of the electrically insulating structure 106 may be in the range from about 100 nm to about 5 mm, depending on the specific design of the electronic device 100 and the type and number of first electronic components 104 being arranged over the electrically insulating structure 106, as illustrated in FIG. 1A.

The distance 107 between the electrically insulating structure 106 (or the buried part of the electrically insulating structure 106) and the upper surface 102*s* of the carrier 102 (or the depth 107 in which the buried electrically insulating structure 106 is located) may be in the range from about several hundreds of nanometers to about several micrometers or up to about several tens of micrometers, e.g. the distance 107 between the electrically insulating structure 106 and the upper surface 102*s* of the carrier 102 may be in the range from about 100 nm to about 500 μm, depending on the specific design of the electronic device 100, the thickness of the carrier 102, and the design of the first electronic component 104.

Furthermore, the electrically insulating structure 106 may be covered with carrier material, as already described, e.g. the carrier may be a silicon wafer or a silicon layer, wherein the electrically insulating structure 106 may include one or more hollow chambers, wherein the inner surfaces of the one or more hollow chambers may be covered with a silicon oxide layer, e.g. with a conformal silicon oxide layer, wherein the isolated region 102*i* over the electrically insulating structure 106 may include silicon. Referring to this, according to various embodiments, the carrier material (silicon) arranged over the buried electrically insulating structure 106 may have an epitaxial relationship to the carrier material below the buried electrically insulating structure 106, which means that the isolated region 102*i* may include single crystalline silicon which may have the same crystallographic orientation as the carrier material of the carrier 102 (e.g. as the carrier material in the second region 102*b* of the carrier 102). The one or more hollow chambers may be formed in the carrier 102 such that the carrier material in the isolated region 102*i* arranged over the one or more hollow chambers may have an epitaxial relationship to the carrier material below the one or more hollow chambers (or may be epitaxially grown on the carrier material below the one or more hollow chambers); the carrier may be a single crystalline silicon substrate. Further, the one or more hollow chambers may not affect the structural properties of the material being arranged above the one or more hollow chambers, e.g. in the isolated region 102*i* of the carrier 102.

The one or more hollow chambers (or the electrically insulating structure 106) may be partially filled with an electrically conductive material, e.g. with silicon, doped silicon, polysilicon, or doped polysilicon. The electrically conductive material being included in the one or more hollow chambers may be surrounded by the electrically insulating material covering the inner surfaces of the one or more hollow chambers. Therefore, the electrically conductive material being included in the one or more hollow chambers (or in the electrically insulating structure 106) may be electrically conductively connected with an electrode or another structure providing an electrical potential to prevent and/or reduce for example the formation of parasitic channels in the carrier 102 and/or to reduce capacitive coupling from the carrier 102 to the isolated region 102*i* of the carrier 102.

Figure 1B:
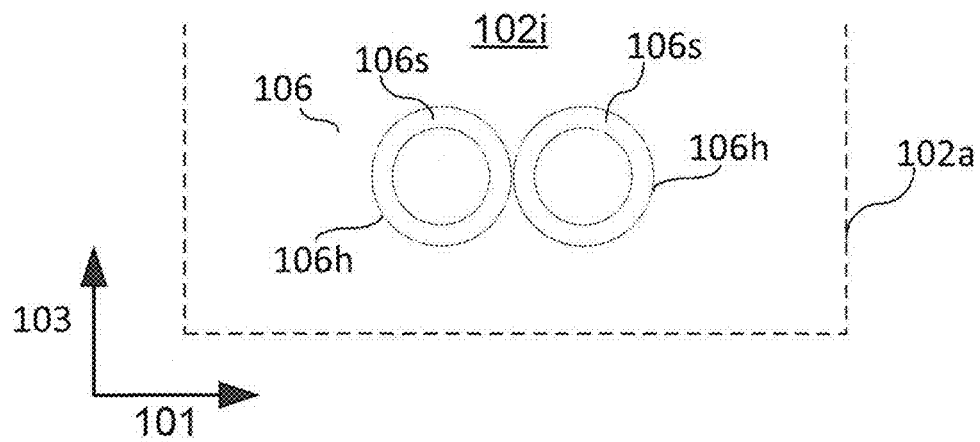
FIGS. 1B to 1D show respectively a schematic view of the electrically insulating structure or a part of the electrically insulating structure being included in the electronic device, according to various embodiments.
Figure 1C:
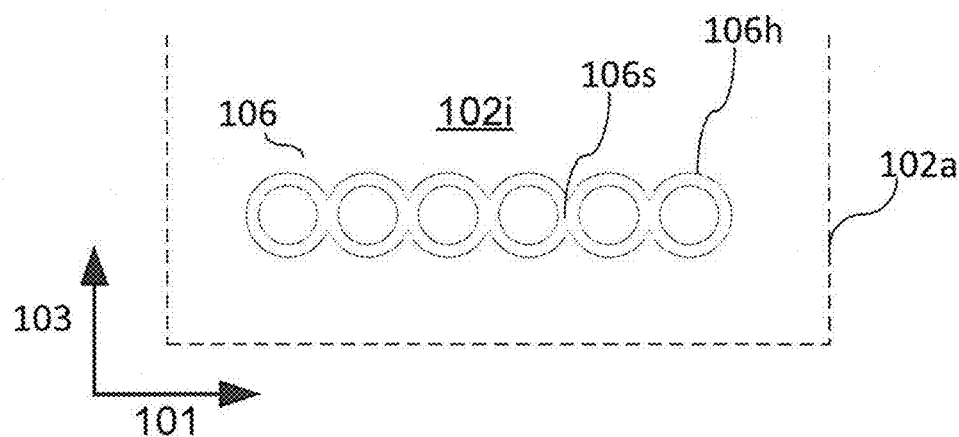
Figure 1D:
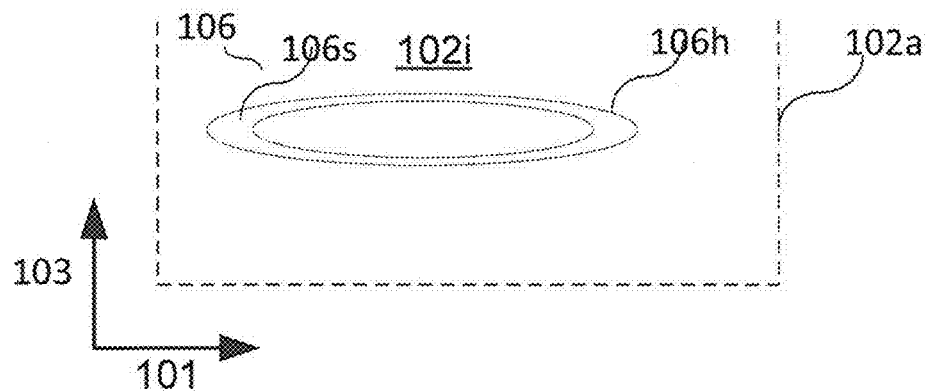

According to various embodiments, FIGS. 1B to 1D respectively illustrate various exemplary modifications of the electrically insulating structure 106 provided in the carrier 102, as already described referring to FIG. 1A. According to various embodiments, the electrically insulating structure 106 may include at least one hollow chamber 106*h*, e.g. exactly one hollow chamber 106*h* or a plurality of hollow chambers 106*h*.

As illustrated in FIG. 1B, at least two hollow chambers 106*h* may be arranged laterally next to each other, e.g. displaces along a direction 101 parallel to the upper surface 102*s* of the carrier 102. Each hollow chamber 106*h* of the plurality of hollow chambers may be arranged in the same depth 107 below the upper surface 102*s* of the carrier 102 (cf. FIG. 1A). According to various embodiments, an isolated region 102*i* (e.g. electrically isolated and/or thermally isolated or partially electrically isolated and/or partially thermally isolated) may be generated by the hollow chambers 106*h* in the carrier 102. The inner surface of each hollow chamber 106*h* of the plurality of hollow chambers 106*h* may be covered (or coated) with an electrically insulating material 106*s*, e.g. with an oxide of the carrier material, e.g. with silicon oxide 106*s*. The respective hollow chambers 106*h* may be separated from each other, may overlap with each other, or may partially overlap with each other.

As illustrated in FIG. 1C, a plurality of hollow chambers 106*h* may be arranged within the carrier 102, e.g. laterally next to each other. The respective hollow chambers 106*h* of the plurality of hollow chambers 106*h* may laterally overlap with each other, e.g. they may overlap with each other along a direction 101 parallel to the above surface 102*s* of the carrier 102, wherein the hollow chambers 106*h* of the plurality of hollow chambers 106*h* may be separated from each other by the electrically insulating material 106*s* covering the inner surfaces of the hollow chambers 106*h*. In other words, the one or more hollow chambers 106*h* may form a single hollow chamber structure, wherein the single hollow chamber structure may be supported by the electrically insulating material 106*s* covering the inner surface of the single hollow chamber structure.

FIG. 1B and FIG. 1C illustrate the electrically insulating structure 106 or the buried electrically insulating structure 106 in a cross sectional view in accordance with various embodiments. Referring to the three-dimensional shape of the one or more hollow chambers, at least one hollow chamber (or each of the hollow chambers) may include a hollow cylinder 106*h* arranged within the carrier 102, wherein the inner surface of the hollow cylinder 106*h* may be covered with an electrically insulating material 106*s*. Further, the hollow chambers 106*h* may form or may include a staggered hollow cylinder arrangement 106 in the carrier 102, as for example shown in FIG. 1B and FIG. 1C.

According to various embodiments, the shape of a hollow chamber or of each hollow chamber of the plurality of hollow chambers may differ from an ideal tube shape or cylindrical shape. The cross section of the one or more hollow chambers 106*h* may include at least one shape of the following group of shapes, the group including: a rounded shape, a circular shape, and elliptical shape, a partially rounded shape (e.g. a rectangular shape with rounded corners), a rectangular shape, or any other suitable and/or processable shape.

As illustrated in FIG. 1D, the electrically insulating structure 106 may include one hollow chamber 106h, wherein the inner surface of the hollow chamber 106h may be covered (or coated) with an electrically insulating material 106s, as already described.

The electrically insulating material 106s may be conformally deposited or a conformally formed over the inner surface or the inner sidewall of the one or more hollow chambers 106h, as illustrated in FIGS. 1B to 1D. Further, the one or more hollow chambers 106h may be filled or at least partially filled with an electrically conductive material (cf. FIG. 2C and FIG. 2E). Therefore, an electrode structure may be arranged in the electrically insulating structure 106 or may be partially arranged in the electrically insulating structure 106. The electrode structure being arranged within the electrically insulating structure 106 may serve to apply a voltage or to generate a desired electrical potential within the isolated region 102i over the electrically insulating structure 106.

Figure 7:
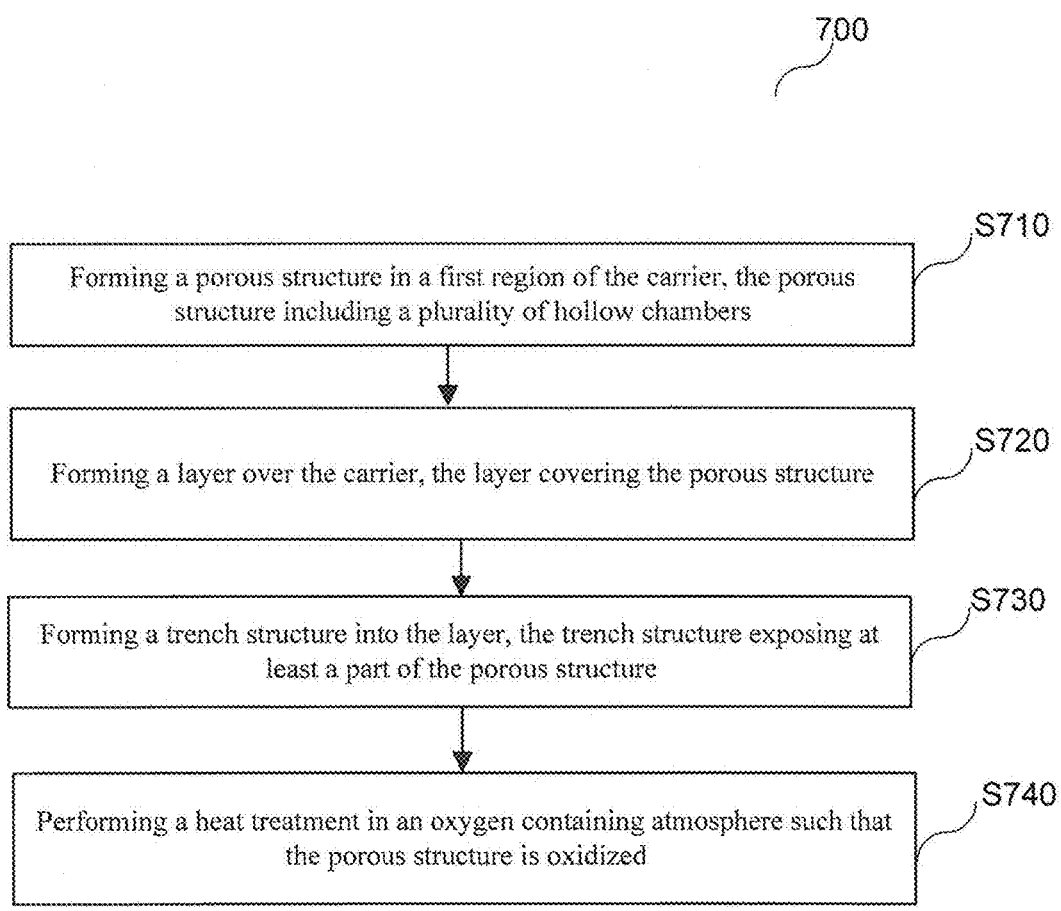
FIG. 7 shows a process flow of a carrier during manufacture of an electronic device, according to various embodiments.

The one or more hollow chambers 106h may be formed within the carrier using a so-called silicon-on-nothing process (e.g. a so-called venezia process), as for example described referring to FIGS. 5A to 5H, or the one or more hollow chambers 106h may be formed by utilizing a porous silicon technique, as for example described referring to FIG. 7 and the FIGS. 8A to 8D.

The electrically insulating structure 106 may further include one or more trenches or a trench structure, the one or more trenches or the trench structure may extend from the upper surface 102s of the carrier 102 to at least the electrically insulating structure 106, thereby forming for example a laterally and/or vertically isolated region 102i, the so-called island (silicon island) or a silicon on insulator island 102i. According to various embodiments, the electrically insulating structure 106 and the trench structure may form a joint electrically isolating structure. In other words, according to various embodiments, the electronic device 100 may include a joint electrically isolating structure including a buried electrically insulating structure 106 and a corresponding electrically isolating trench structure, as for example shown in FIGS. 2A to 2E.

Various modifications and/or configurations of the electronic device 100 and details referring to the electrically insulating structure 106, the first electronic component 104, and the second electronic component 108 are described in the following, wherein the features and/or functionalities described referring to FIGS. 1A to 1D may be included analogously. Further, the features and/or functionalities described in the following may be included in the electronic device 100 or may be combined with the electronic device 100, as described before referring to FIGS. 1A to 1D.

Figure 2A:
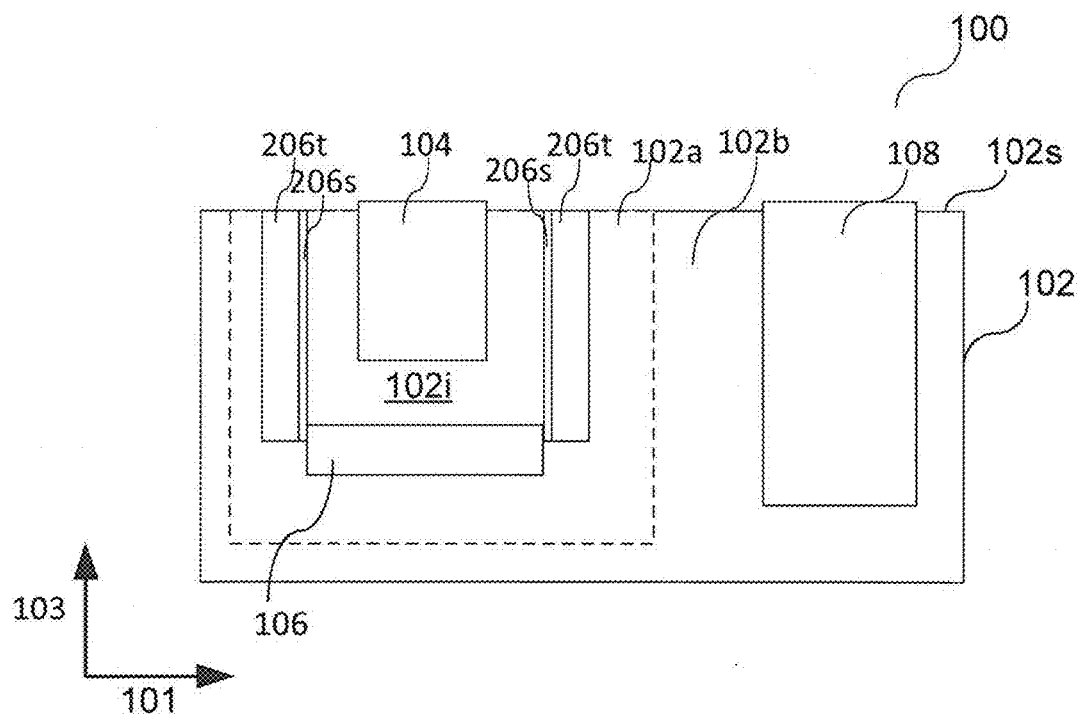

FIG. 2A schematically illustrates an electronic device 100 including for example a carrier 102, a first electronic component 104 being arranged in a first region 102a of the carrier 102, an electrically insulating structure 106 being arranged in the first region 102a of the carrier 102 below the first electronic component 104, a second electronic component 108 being arrange outside the first region 102a of the carrier 102 (e.g. in a second region 102b of the carrier 102), as for example already described referring to FIG. 1A, and further, the electronic device 100 may include a first trench structure 206t. According to various embodiments, the first trench structure 206t may include at least one trench, e.g. one trench 206t or a plurality of trenches 206t. According to various embodiments, the electrically insulating structure 106 may include the first trench structure 206t or may be arranged adjoining to the first trench structure 206t, as shown for example in FIG. 2A. According to various embodiments, the first electronic component 104 may be at least partially disposed in the carrier 102 above the electrically insulating structure 106 and the first electronic component 104 may be at least partially surrounded by the first trench structure 206t. According to various embodiments, the first electronic component 104 may be disposed in the carrier 102 above the electrically insulating structure 106, e.g. above the electrically insulating structure 106 being buried in the carrier; and further, the first electronic component 104 may be surrounded (e.g. completely surrounded) by the first trench structure 206t.

The first trench structure 206t may electrically isolate the isolated region 102i of the carrier 102. The first trench structure 206t may electrically isolate the isolated region 102i being arranged in the carrier 102 along a lateral direction, wherein the electrically insulating structure 106 may electrically isolate the isolated region 102i along a vertical direction. Further, at least one sidewall of at least one trench included in the first trench structure 206t may be covered or coated with an electrically insulating material 206s. According to various embodiments, the first trench structure 206t may be formed in the silicon wafer, wherein at least one sidewall of the first trench structure 206t may be covered with silicon oxide. According to various embodiments, the electrically insulating material 206s may be deposited or formed (e.g. conformally deposited) over the surface (e.g. over the exposed surface) of the first trench structure 206t.

As schematically shown in FIG. 2A, the first trench structure 206t may extend from the upper surface 102s of the carrier 102 to the electrically insulating structure 106, such that a joint electrically isolating structure may be formed, e.g. including at least the electrically insulating structure 106 and the first trench structure 206t; the joint electrically isolating structure electrically isolating the isolated region 102i. In other words, a silicon island 102i may be electrically separated from the carrier 102 by the joint electrically isolating structure including the electrically insulating structure 106 and the first trench structure 206t. Further, the electrically insulating structure 106 and/or the first trench structure 206t may further provide a thermal isolation or may thermally isolate the region 102i above the electrically insulating structure 106.

Figure 5A:
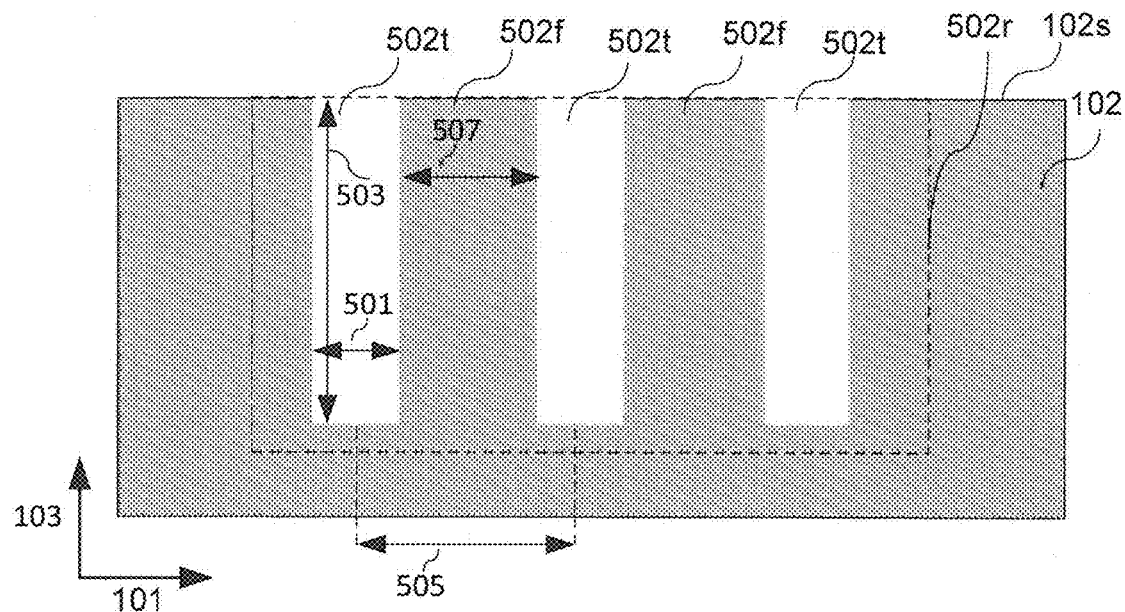
FIGS. 5A to 5G show respectively a schematic view of a carrier at various processing stages during manufacture of an electronic device, according to various embodiments.
Figure 5B:
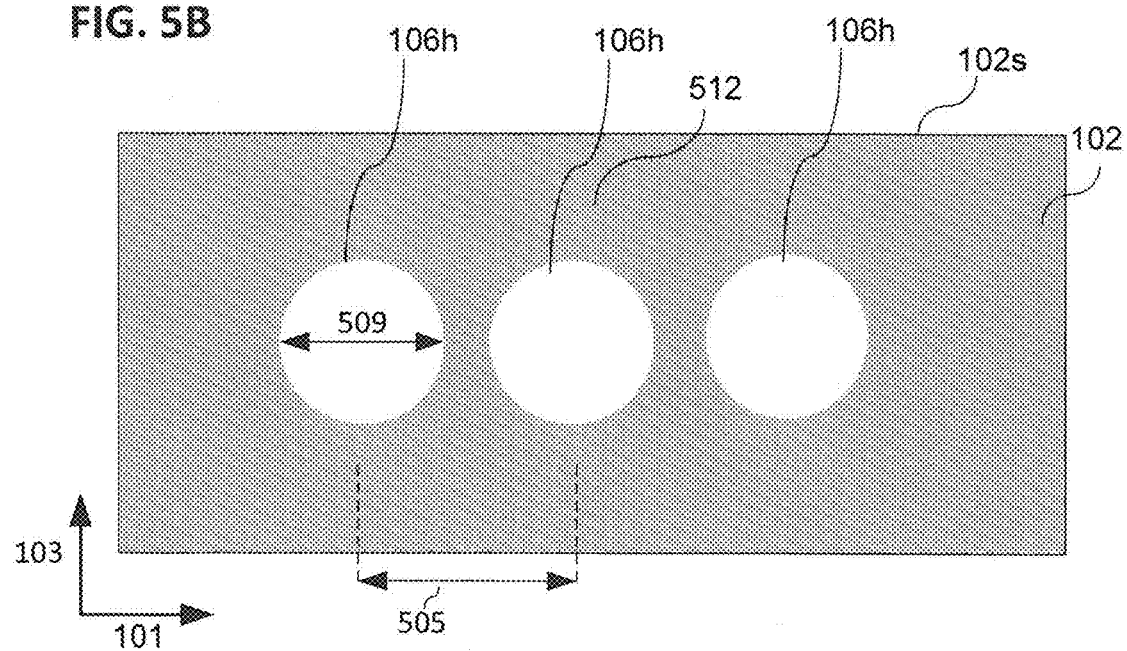
Figure 5C:
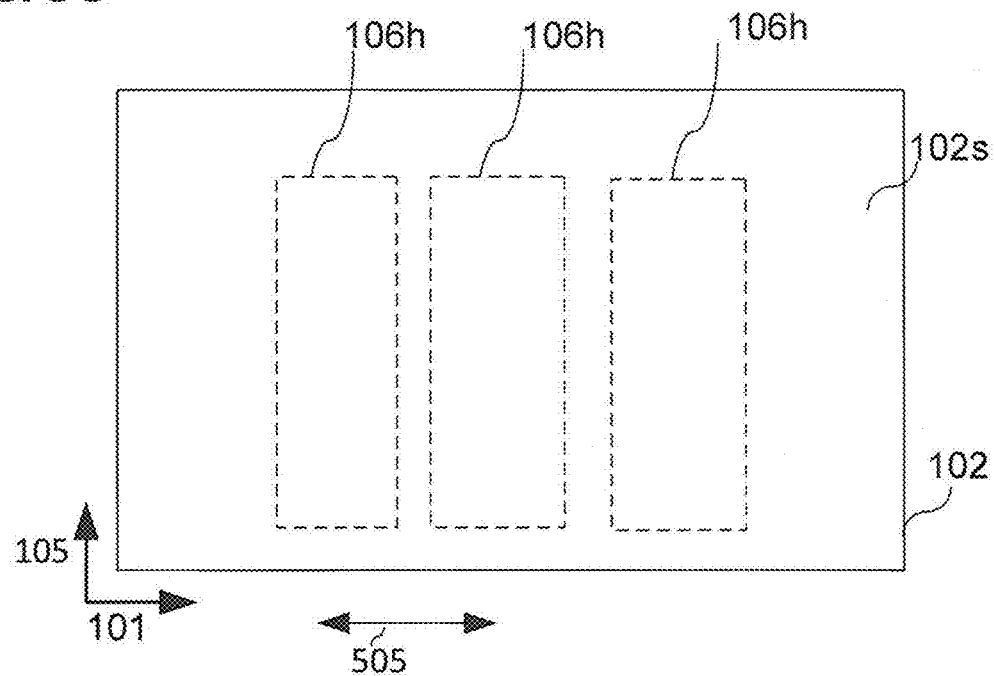
Figure 5D:
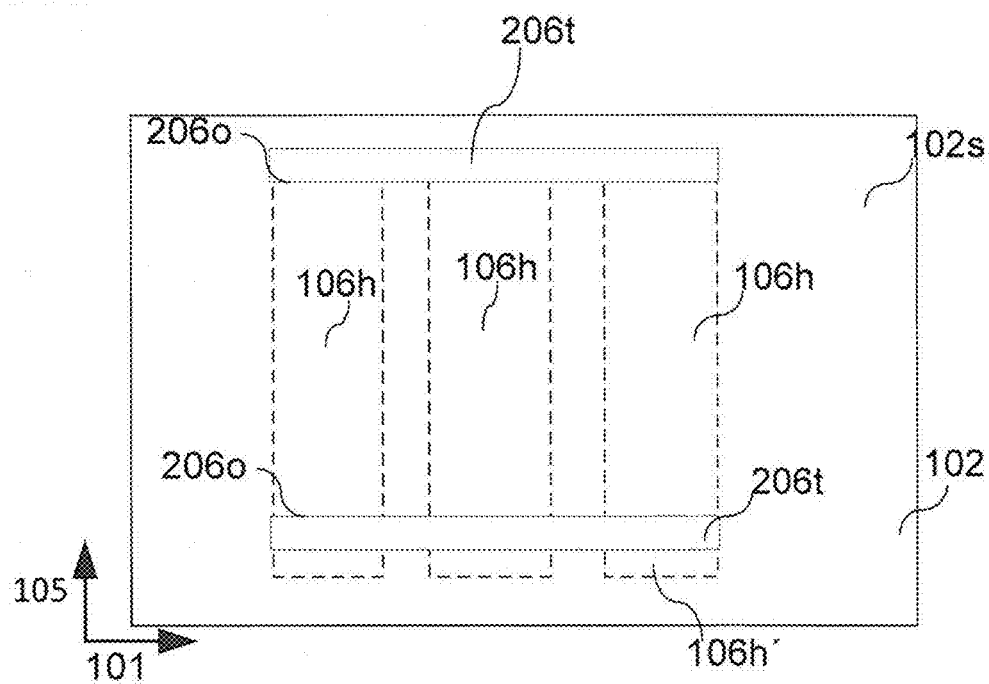
Figure 5E:
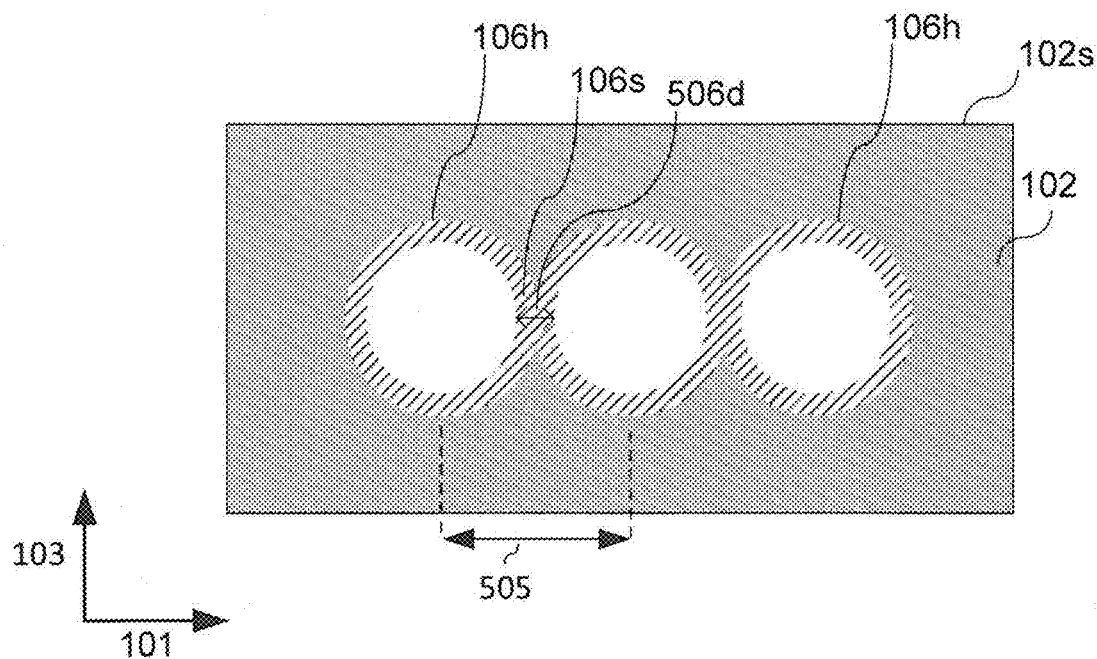
Figure 5F:
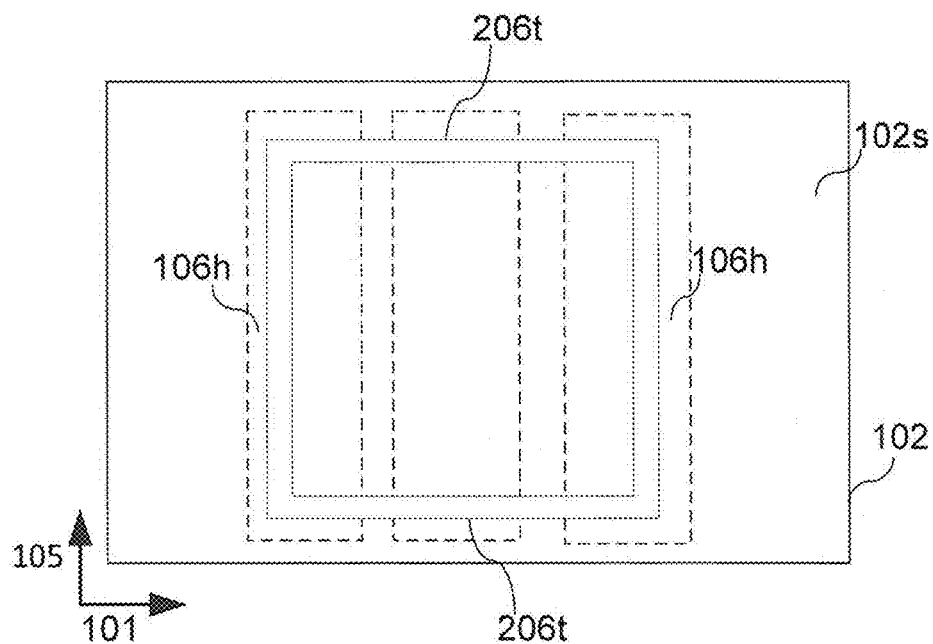
Figure 5G:
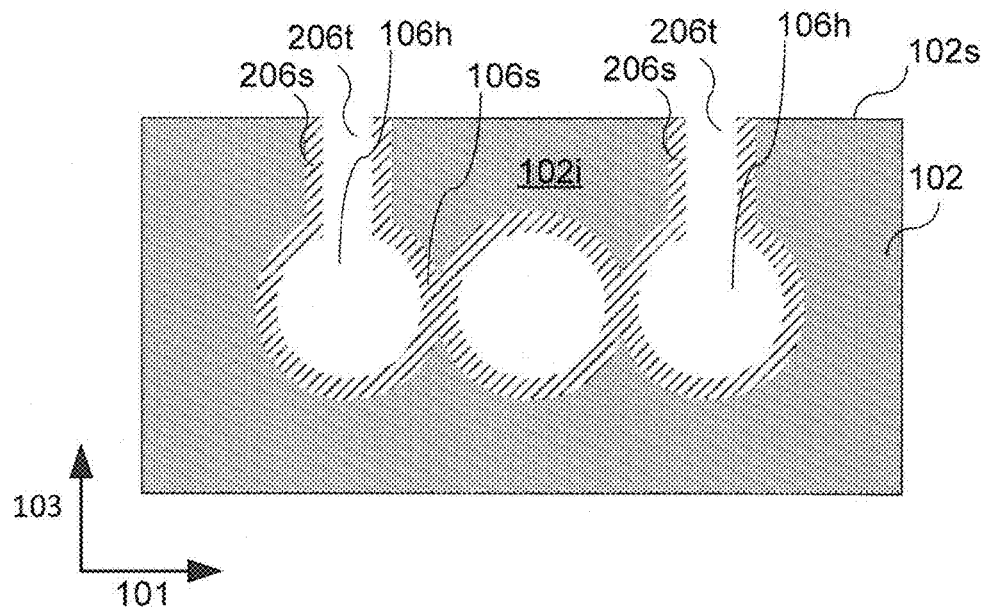
Figure 5H:
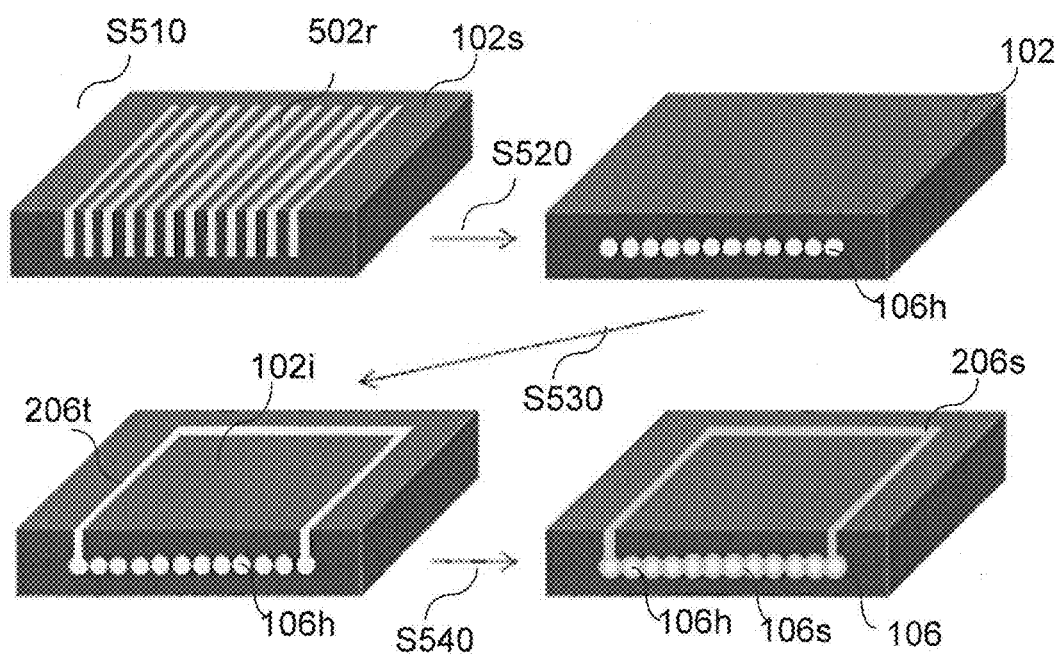
FIG. 5H shows a process flow and corresponding schematic views of a carrier during manufacture of an electronic device, according to various embodiments.

The first trench structure 206t, e.g. seen from the top of the carrier 102, e.g. viewed from a direction perpendicular to the upper surface 102s of the carrier 102, may surround or may be configured to surround the first electronic component 104; wherein the first trench structure 206t may have for example an arbitrary frame shape, e.g. a circular frame shape, a rectangular frame shape, and the like (cf. FIG. 5H).

The first trench structure 206t may be configured to prevent or reduce a lateral current flow from the first electronic component 104 to the second electronic component 108 through the carrier 102. If the first electronic component 104 may be for example configured to communicate with the second electronic component 108, an additional metallization structure may be disposed over the carrier 102, electrically connecting the first electronic component 104 with the second electronic component 108 as desired (not shown).

According to various embodiments, the carrier 102 may include a doped surface region or may be a doped carrier such that the carrier may be electrically conducting, wherein the electrically insulating structure 106 and/or the first trench structure 206t may be formed in the electrically conducting region of the carrier 102 to electrically and/or thermally isolate two different regions in the electrically conducting region of the carrier 102. This may allow providing different working conditions or a different operating environment for different electronic components 104, 108 arranged at least partially in the carrier 102 or in the electrically conducting region of the carrier 102.

Figure 2B:
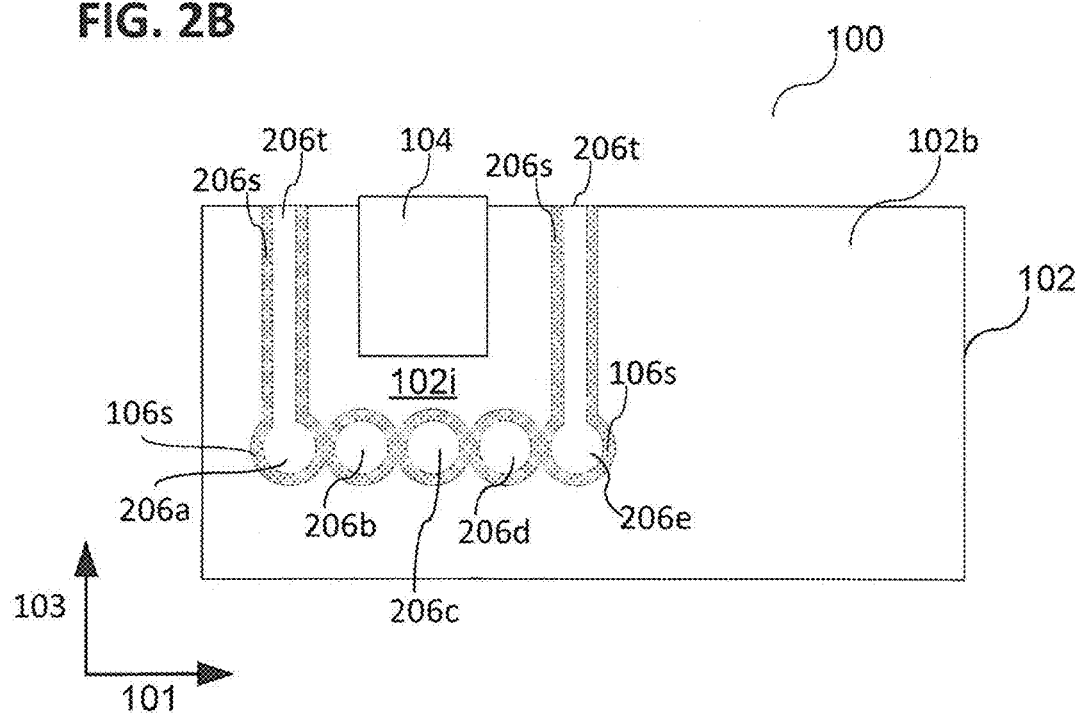

FIG. 2B schematically illustrates an electrically insulating structure 106 and a first trench structure 206t being arranged in the carrier 102, wherein the first trench structure 206t may be connected or may adjoin the electrically insulating structure 106, the electrically insulating structure 106 including a plurality of hollow chambers (or hollow structures, cavities, holes, cylindrical holes, voids) 206a, 206b 206c, 206d, 206e. The sidewalls of the first trench structure 206t and the sidewalls of the one or more hollow chambers may be coated (e.g. conformally coated) with an electrically insulating layer 106s, 206s or the sidewalls of the first trench structure 206t and the sidewalls of the one or more hollow chambers may include an electrically insulating material 106s, 206s. The first trench structure 206t may be connected to the plurality of hollow chambers 206a, 206b 206c, 206d, 206e or to at least part of the plurality of hollow chambers 206a, 206b 206c, 206d, 206e. The first trench structure 206t and the plurality of hollow chambers 206a, 206b 206c, 206d, 206e may be configured to electrically separate the isolated region 102i from the rest of the carrier 102. The thickness of the electrically insulating material 106s, 206s or the thickness of the electrically insulating layer 106s, 206s covering the inner surfaces (the exposed surfaces) of the first trench structure 206t and the inner surfaces of the one or more hollow chambers 206a, 206b 206c, 206d, 206e may be adapted to the specific requirements, e.g. may be adapted to a specific current and/or a specific voltage to be isolated by the first trench structure 206t and the plurality of hollow chambers 206a, 206b 206c, 206d, 206e. The thickness of the electrically insulating material 106s, 206s may be adapted to the specific potential difference between isolated region 102i and the voltage in the rest of the carrier below the electrically insulating structure 106 to be blocked, or to a specific (desired) electrical voltage to sustain.

FIG. 2C schematically illustrates an electrically insulating structure 106 and a first trench structure 206t being arranged in the carrier 102, wherein the first trench structure 206t and/or the electrically insulating structure 106 may be filled or at least partially filled with an additional material 206m, e.g. with an electrically conductive material.

The first trench structure 206t may be filled or at least partially filled with an additional material 206m or at least one sidewall (e.g. one or more sidewalls) of the first trench structure 206t may be covered with an additional material 206m. Each hollow chamber of the plurality of hollow chambers 206a, 206b 206c, 206d, 206e may be filled or at least partially filled with an additional material 206m or at least one sidewall (e.g. one or more sidewalls) of each hollow chamber of the plurality of hollow chambers 206a, 206b 206c, 206d, 206e may be covered with an additional material 206m. The two hollow chamber 206a, 206e being connected to the first trench structure 206t may be for example completely or partially filled with an additional material 206m. Since the first trench structure 206t may also intersect the hollow chambers 206a, 206b 206c, 206d, 206e in a direction into the drawing plane (cf. FIG. 5H) the filling of the hollow chambers 206a, 206b 206c, 206d, 206e with the additional material 206m may differ with the distance from the intersecting first trench structure 206t.

The additional material 206m may include at least one material of the following group of materials, the group including: a metal, a metallic material, copper, aluminum, silver, gold, platinum, titanium, titanium nitride, an electrically conductive material, an alloy, a silicon/metal alloy, and aluminium/silicon alloy, or another electrically conductive material, as for example doped silicon, doped polysilicon (p-type or n-type doped polysilicon).

According to various embodiments, the additional electrically conductive material 206m may allow applying an electrical potential or applying a voltage, for example such that a specific operating environment may be provided in the isolated region 102i. Further, the additional electrically conductive material 206m may allow applying an electrical potential or applying a voltage to prevent parasitic channels or the formation of parasitic channels in the carrier 102. The one or more hollow chambers included in the electrically isolating structure 106 may enable to provide an electrode structure being formed in the electrically isolating structure 106.

The electrically insulating structure 106 may include an additional electrically conductive material 206m, the additional electrically conductive material 206m being separated from the carrier 102 by an electrically insulating layer 206s, wherein the electrically insulating layer 206s may be arranged between the additional electrically conductive material 206m and the carrier 102.

The electrically insulating structure 106 may include a plurality of hollow chambers being filled or partially filled with an electrically conductive material 206m the electrically conductive material 206m being separated from the carrier 102 by an electrically insulating layer 106s arranged between the electrically conductive material 206m and the carrier 102, the electrically insulating layer 106s covering the sidewalls of the hollow chambers 106.

As schematically illustrated in FIG. 2D, the second electronic component 108 may include a second trench 208t or a second trench structure 208t (e.g. including one or more trenches 208t). In other words, the carrier 102 may include a second trench structure 208t in the second region 102b of the carrier 102, wherein the second trench structure 208t may be for example a part of the second electronic component 108 or may represent the second electronic component 108, e.g. a trench capacitor, e.g. a trench gate, e.g. a gate structure of a transistor, e.g. a gate structure of a vertical transistor. According to various embodiments, at least one sidewall of the second trench structure 208t or the exposed surface of the second trench structure 208t may be covered or coated with an electrically insulating material 208s, e.g. the trench structure 208t may be formed in a silicon substrate wherein the sidewalls of the second trench structure 208t may be covered with silicon oxide or may include silicon oxide.

According to various embodiments, the second trench structure 208t may have the same depth 207 as the first trench structure 206t. This may for example allow forming both trench structures 206t, 208t in a single process. According to further embodiments, the second trench structure 208t may have a width differing from that of the first trench structure 206t allowing different depths of the first and second trench structures even though they have been formed in the same process step.

Figure 2E:
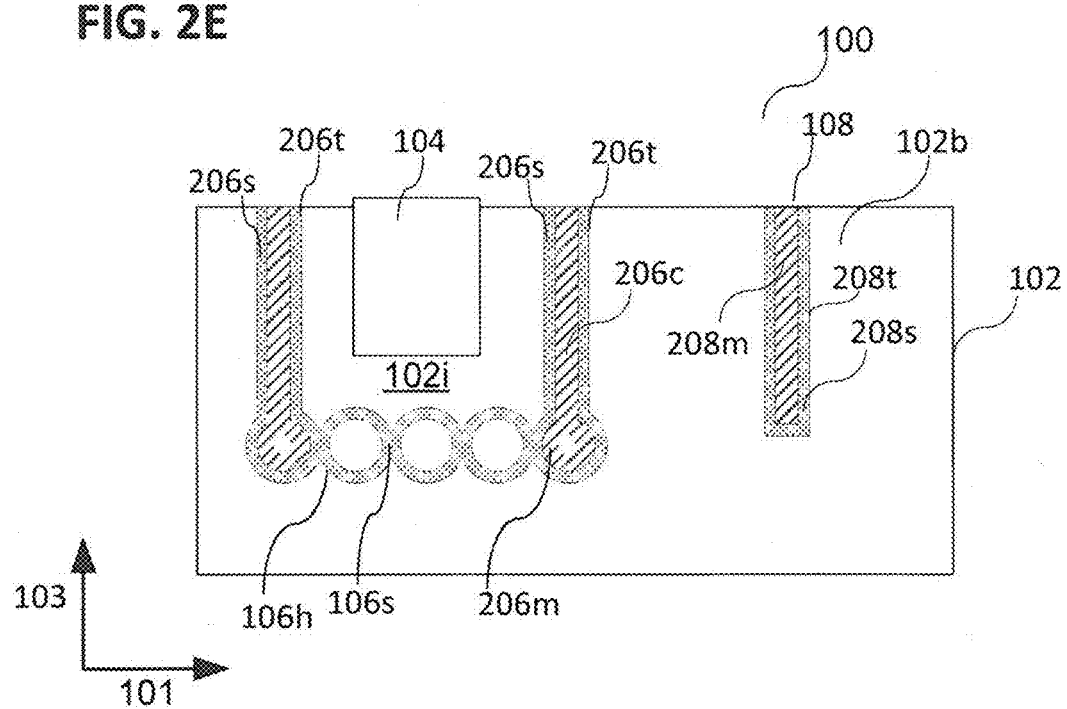

As schematically illustrated in FIG. 2E, the second trench structure 208t may be filled or at least partially filled with an additional material 208m, e.g. an electrically conductive material, a metal, doped silicon, doped polysilicon, and the like. The additional material 208m of the second trench structure 208t may provide an electrode in the second trench structure 208t. According to various embodiments, the additional material 208m of the second trench structure 208t may provide an electrically isolated electrode 208m in the trench 208t or in the trench structure 208t.

According to various embodiments, the second trench 208t (or recess 208t) of the second electronic component 108 may have at least one of the following shapes: a cylindrical shape, a cuboid shape, a prismatic shape.

According to various embodiments, the first trench structure 206t and the second trench structure 208t may be filled or partially filled with the same electrically conductive material 206m, 208m. This may allow processing the first trench structure 206t and the second trench structure 208t in a single process.

Figure 2F:
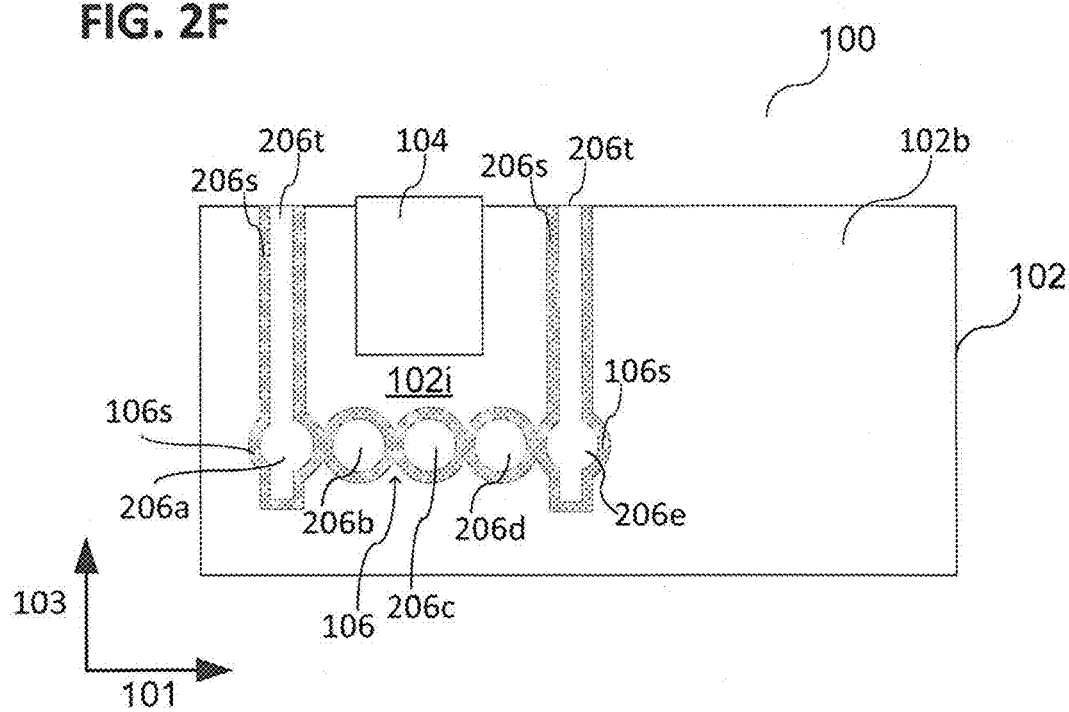

According to a further embodiment and as illustrated in FIG. 2F, the first trench structure 206t may reach deeper into the carrier 102 than the insulating structure 106. According to various embodiments, the first trench structure 206t may reach deeper into the carrier 102 than the insulating structure 106 at least where the trench structure 206t meets the hollow chambers 206a, 206e. In other words, the trench structure 206t may end at a deeper depth level within the carrier than the depth level of the insulating structure 106; the insulating structure 106 including the hollow chambers 206a, 206b, 206c, 206d, 206e. According to various embodiments, at least a part of the first trench structure 206t may extend, e.g. vertically, through the insulating structure 106.

Figure 3:
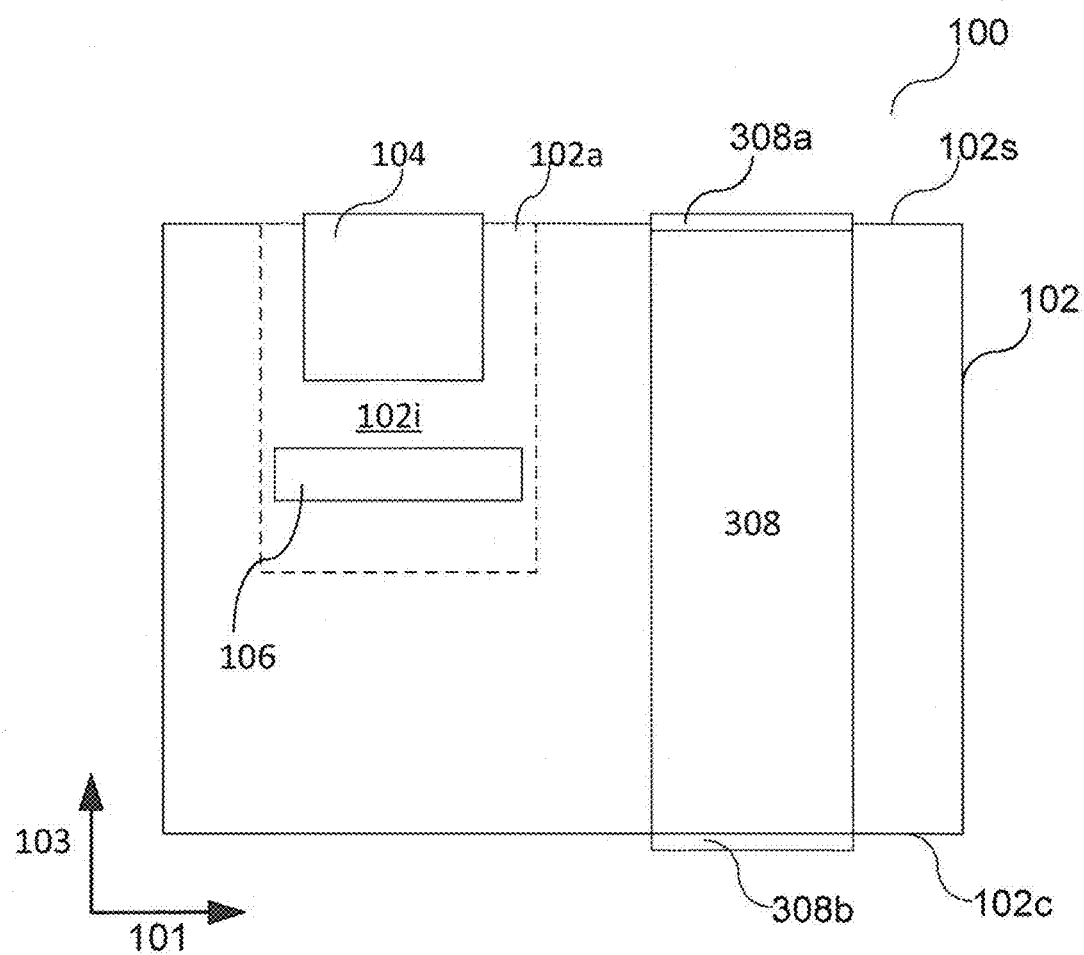
FIG. 3 shows a schematic view of an electronic device, according to various embodiments.

FIG. 3 schematically illustrates an electronic device 100, in analogy to the electronic device 100 described referring to FIG. 1A, wherein the second electronic component 108 may be configured as a vertical semiconductor component 308 (e.g. a vertical MOSFET or a vertical IGBT).

The vertical semiconductor component 308 may extend through the carrier 102 from an upper surface 102s of the carrier 102 to a bottom surface 102c of the carrier 102. The vertical semiconductor component 308 may be configured to provide a vertical current flow. The vertical semiconductor component 308 may include at least a first electrode structure 308a arranged on the upper surface 102s of the carrier 102 and a second electrode structure 308b arranged on the bottom surface 102c of the carrier 102, for injecting a vertical current into the vertical semiconductor component 308. The first electrode structure 302a may include a gate structure to control the current flow in the vertical semiconductor component 308.

The vertical current flow in the vertical semiconductor component 308 may not be disturbed by the electrically insulating structure 106. The vertical semiconductor component 308 may be formed in the carrier 102 surrounding the isolated region 102i of the carrier 102. The vertical semiconductor component 308 may be controlled or may communicate with the first electronic component 104 arranged in the isolated region 102i. The vertical semiconductor component 308 may include a second trench structure 208t as described before, e.g. to control the current flow in the vertical semiconductor component 308.

Figure 4:
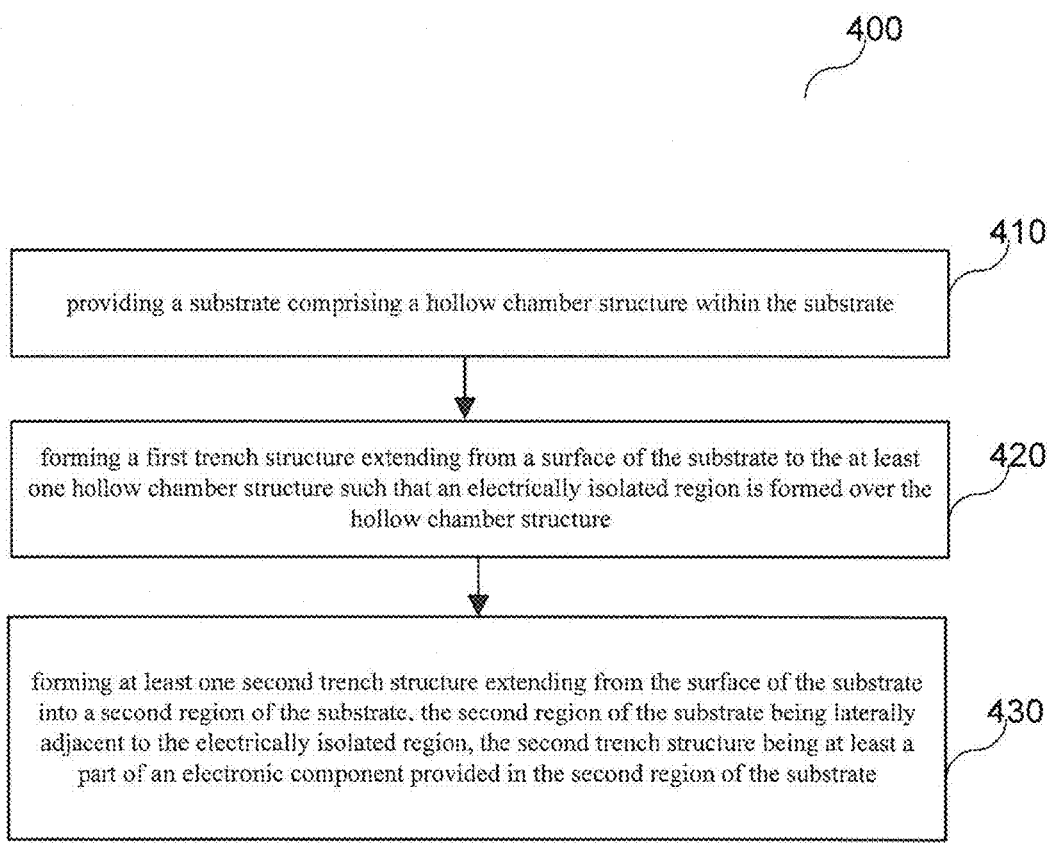
FIG. 4 shows a schematic flow diagram of a method for manufacturing an electronic device, according to various embodiments.

As shown in FIG. 4, a method 400 for manufacturing an electronic device 100 may include: in 410, providing a carrier 102 including a hollow chamber structure 106 in a first region 102a of the carrier 102; in 420, forming a first trench structure 206t extending from a surface 102s of the carrier 102 to the at least one hollow chamber structure 106 such that an electrically isolated region 102i is formed over the hollow chamber structure 106; and e.g. at the same time, forming at least one second trench structure 208t extending from the surface 102s of the carrier 102 into a second region 102b of the carrier 102b, the second region 102b of the carrier 102 being laterally adjacent to the electrically isolated region 102i, the second trench structure 208t being at least a part of an electronic component 108 provided in the second region 102b of the carrier 102.

The method 400 for manufacturing an electronic device 100 may be configured to provide an electronic device 100, 600 as described herein.

Forming the at least one first trench structure 206t and forming the at least one second trench structure 208t may further include covering at least one sidewall of each trench structure 206t, 208t with an electrically insulating material 206s, 208s (e.g. covering at least one sidewall of each trench structure 206t, 208t with an oxide).

According to various embodiments, forming the at least one first trench structure 206t and forming at least one second trench structure 208t may further include at least partially filling the trench structures 206t, 208t with an electrically conductive material 206m, 208m (e.g. with doped polysilicon).

According to various embodiments, the electronic device 100 and/or the method 400 for manufacturing an electronic device 100 may be configured such that the first trench structure 206t and the second trench structure 208t may be formed in the very same process, e.g. by applying a patterned mask structure (e.g. a patterned soft mask or a patterned hard mask layer) and subsequently performing an etch process (e.g. reactive ion etching or deep reactive ion etching). Further, the electronic device 100 and/or the method 400 for manufacturing an electronic device 100 may be configured such that the exposed sidewalls of the first trench structure 206t and the exposed sidewalls of the second trench structure 208t may be covered with an electrically insulating material in the very same process, e.g. using a conformal layering process or a conformal deposition process (e.g. thermal oxidation, e.g. atomic layer deposition, e.g. low pressure chemical vapor deposition). Further, the electronic device 100 and/or the method 400 for manufacturing an electronic device 100 may be configured such that the first trench structure 206t and the second trench structure 208t may be filled or partially filled with an electrically conductive material 206m, 208m in the very same process, e.g. using a conformal layering process or a conformal deposition process (e.g. atomic layer deposition or low pressure chemical vapor deposition).

According to various embodiments, the method 400 for manufacturing an electronic device 100 may further include: forming an additional electrical component 104 (the first electronic component 104) in the electrically isolated region 102i, wherein the additional electrical component 104 being separated from the electronic component 108 may be provided in the second region 102b of the carrier 102, as illustrated in FIGS. 2A to 2E.

According to various embodiments, the method 400 for manufacturing an electronic device 100 may further include: forming a metallization structure over the carrier 102, the metallization structure may be configured to electrically connect the electronic component 108 (the second electronic component 108) provided in the second region 102b of the carrier 102 with the additional electrical component 104 provided in the electrically isolated region 102i of the carrier 102, as described before.

According to various embodiments, the method 400 for manufacturing an electronic device 100 may include forming a hollow chamber structure 106 within the carrier 102 by preforming a silicon on nothing process (venezia process), as described herein referring for example to FIG. 5H.

According to various embodiments, the method 400 for manufacturing an electronic device 100 may include forming a hollow chamber structure 106 within the carrier 102 by preforming a process sequence including forming a porous silicon region in the carrier 102 and oxidizing the pores of the porous silicon region subsequently, as described herein for example to FIG. 7.

According to various embodiments, in the following FIGS. 5A to 5H a method may be provided for forming one or more hollow chambers 106h or hollow structures 106 in the carrier 102, as described before.

According to various embodiments, a method for processing a carrier (e.g. for forming an electrically insulating structure 106 in a carrier 102, or for forming a plurality of hollow chambers in a carrier 102) may include: forming at least one initial recess structure 502r at least one of over and in a first region 102a of the carrier 102; and subsequently annealing the at least one initial recess structure 502r such that one or more hollow chambers 106h may be formed by material of the at least one initial recess structure 502r.

As schematically illustrated in FIG. 5A, according to various embodiments, the initial recess structure 502r may include one or more recesses 502t formed in the carrier 102. According to various embodiments, the same initial recess structure 502r may be formed by patterning a prior deposited surface layer, e.g. by forming one or more structure elements 502f at least one of over and in a the carrier 102.

The carrier 102 may be a silicon wafer 102 or a silicon substrate 102, according to various embodiments. The carrier 102 may be an arbitrary type of carrier, as already described, including a carrier surface layer 102, wherein the carrier surface layer 102 may be a silicon layer 102. The process of forming an initial recess structure 502r in a carrier 102, as described herein, may be applied in analogy to a carrier 102 having a silicon surface layer, which may be not described in more detail for sake of brevity.

A process for forming at least one initial recess structure 502r at least one of over and in the carrier 102 may include patterning the carrier 102. Therefore, a patterned mask layer may be disposed over the carrier 102, wherein the patterned mask layer may at least partially cover the carrier 102 and may expose at least one region of the carrier, and subsequently carrier material may be partially removed from the at least one exposed region of the carrier 102 to form at least one recess structure 502r in the carrier 102.

According to various embodiments, the shape, the size, the positions, and the number of recesses 502t included in the initial recess structure 502r may be selected in accordance with the desired electrically insulating structure 106 to be formed in the carrier 102. The shape, the size, the positions, and the number of recesses 502t included in the initial recess structure 502r may be selected in accordance with the desired shape, size, positions, and number of hollow chambers 106h to be formed in the carrier 102.

According to various embodiments, at least one etch process may be applied to partially remove the respective carrier material to provide the at least one recess structure 502r, wherein the least one etch process may include a dry etch process, e.g. reactive ion etching, e.g. deep reactive ion etching. A reactive etch process, as described herein, may include at least one of the following etch chemistries: $SF_6$, $O_2$, HBr, $NF_3$, $C_4F_8$, and $C_4F_6$. The etch process may be selective to the carrier material, e.g. selective to silicon, such that a patterned mask layer may be utilized to remove the carrier material partially at the desired positions, and therefore, forming at least one or more recesses 502t at the desired positions. The recesses 502t of the initial recess structure 502r may be surrounded by carrier material (silicon). The recesses 502t included in the at least one recess structure 502r may have an aspect ratio (the ratio of the depth of the recess to the width of the recess), in the range from about 2 to about 50, e.g. in the range from about 2 to about 30, e.g. in the range from about 4 to about 10.

As shown in FIG. 5A, a plurality of recesses 502t may be formed in carrier 102. The plurality of recesses 502t may represent an initial recess structure 502r. Each recess 502t of the plurality of recesses may have a rectangular shape, a quadratic shape, or a trapezoidal shape in the cross sectional view (or a substantially rectangular shape, e.g. a rectangular shape with rounded corners, or a substantially quadratic shape, e.g. a quadratic shape with rounded corners, or a substantially trapezoidal shape, e.g. a trapezoidal shape with rounded corners), as illustrated in FIG. 5A. The base area of a recess 502t included in the at least one recess structure 502r, e.g. seen from the top, may have the shape as defined by the patterned mask layer, e.g. a rectangular shape, a quadratic shape, a polygonal shape, a circular shape or an elliptic shape. A recess 502t may have the form (or shape) of a right prism, e.g. a cube, a cuboid, a cylinder and the like, or the form (or shape) of a right prism with rounded corners. According to various embodiments, the shapes of the structures may differ from ideal geometric shapes due to the semiconductor processing.

As shown in the cross sectional view in FIG. 5A, at least one recess 502t of the plurality of recesses 502t, or all recesses of the plurality of recesses 502t, may have a depth 503 in the range from about 1 μm to about 500 μm, e.g. in the range from about 1 μm to about 100 μm. According to various embodiments, at least one recess 502t of the plurality of recesses 502t, or all recesses of the plurality of recesses 502t, may have a width 501 (or in the case of cylindrical shapes a diameter 501) in the range from about 0.1 μm to about 50 μm, e.g. in the range from about 0.2 μm to about 20 μm, e.g. in the range from about 0.3 μm to about 5 μm. According to various embodiments, the distance 505 between two adjacent recesses 502t of the recess structure 502r, measured from the center of the first recess to the center of the second recess, may be in the range from about 0.2 μm to about 100 μm. Therefore, according to various embodiments, the width 507 of the remaining carrier material 502f between respectively two adjacent recesses 502t of the recess structure 502r may be, as a result of the width 501 and the distance 505, in the range from about 0.1 μm to about 100 μm.

According to various embodiments, the depth 503 of a recess 502t of the initial recess structure 502r may define or may influence the depth position of the respective hollow chamber 106h formed from the recess 502t, e.g. in a subsequently performed annealing process or heat treatment. The distance between two adjacent recesses 502t of the initial recess structure 502r may define or may influence the distance 505 between two adjacent hollow chambers 106h formed from the recess 502t. The aspect ratio of a recess 502t of the initial recess structure 502r may define or may influence the size of the respective hollow chamber 106h formed from the recess 502t, e.g. in a subsequently performed annealing process. In summary, the arrangement of the one or more recesses 502t in the initial recess structure 502r may determine and/or influence the arrangement of the one or more hollow chambers 106h generated in the carrier 102, e.g. the one or more hollow chambers 106h may be formed from the initial recess structure 502r during a subsequently performed annealing process.

According to various embodiments, the at least one recess structure 502r may include one recess or more than one recesses, e.g. any other number of recesses, e.g. two, three, four, six, seven, eight, nine, ten, or even more than ten, or more than 20 over even hundreds of recesses 502t, depending on the desired number, shape and/or size of hollow chambers 106h to be formed. According to a further embodiment, doping atoms may be introduced at the bottom of the recess structures 502t, e.g. by ion implantation, to provide a buried doping region.

An annealing process may be carried out after the initial recess structure 502r has been formed. As illustrated in FIG. 5B, one or more hollow chambers 106h may be formed during the annealing process of the initial recess structure 502r is carried out, e.g. due to the migration of material of the at least one recess structure, e.g. due to the migration of silicon 502f surrounding the recesses 502t. The migration of material of the recess structure 502r may form one or more hollow chambers 106h in a first region 102a of the carrier 102. According to various embodiments, the lateral extension 509 of the one or more hollow chambers 106h may be in a range from about several hundreds of nanometers up to several micrometers or even up to several tens of micrometers.

According to various embodiments, the thickness of the material layer 512 covering the one or more hollow chambers 106h or thickness of the material region 512 (the isolated region 102i) above the one or more hollow chambers 106h may be in the range from about 0.2 µm to about 100 µm. The material layer or material region 512 covering the one or more hollow chambers 106h may include silicon (e.g. doped silicon).

According to various embodiments, the annealing process being utilized for forming the one or more hollow chambers 106h from the initial recess structure 502r may cause at least one of migration, diffusion, material transport, and material rearrangement of the material surrounding the one or more recesses 502t included in the initial recess structure 502r while forming the one or more hollow chambers 106h.

According to various embodiments, the annealing process being utilized to form the one or more hollow chambers 106h from the initial recess structure 502r may be performed using temperatures in the range from about 800° C. to about 1400° C., e.g. in the range from about 900° C. to about 1300° C., e.g. in the range from about 1100° C. to about 1200° C. According to various embodiments, the duration of the annealing process may be at least in the range from about several minutes, e.g. larger than 3 min, e.g. larger than 5 min, e.g. larger than 10 min. According to various embodiments, the annealing process may be carried out under vacuum conditions. According to various embodiments, the annealing process may be carried out in the absence of a significant oxygen amount (or oxygen partial pressure), e.g. in nitrogen atmosphere, e.g. in an argon atmosphere, e.g. in a chemical reducing atmosphere including nitrogen and hydrogen (e.g. a mixture of nitrogen with 2% to 20% hydrogen), e.g. in a chemical reducing atmosphere including argon and hydrogen (e.g. a mixture of argon with 2% to 20% hydrogen).

According to various embodiments, the one or more hollow chambers 106h may also be referred to as empty space in silicon structure and the material 512 over the one or more hollow chambers 106h may be referred to as silicon on nothing structure or migrated silicon region. The migrated silicon region may have a first thickness after the annealing process, wherein additional material may be deposited over the annealed carrier increasing the thickness of the isolated region 512 over the one or more hollow chambers 106h.

According to various embodiments, the size and/or the shape of the one or more hollow chambers 106h, the thickness of the migrated silicon region 512, and the position of the one or more hollow chambers 106h may be controlled and/or influenced by the design of the recess structure 502r, and therefore, by patterning the carrier 102, which may be performed using processes of semiconductor industry, as described herein. The one or more hollow chambers 106h may be surrounded by silicon, e.g. completely surrounded by silicon. In other words, the one or more hollow chambers 106h may not have an opening after being formed during the annealing process.

According to various embodiments, the size, the shape, and the position of the one or more hollow chambers 106h may not change or vary in a further heat treatment. According to various embodiments, the one or more hollow chambers 106h may be stable in size, shape, and/or position up to temperatures of about 1300° C. According to various embodiments, the one or more hollow chambers 106h may provide a stable electrically insulating structure 106 in a carrier, wherein the carrier may be processed at high temperatures, as for example typical high temperature processes included in manufacturing an integrated circuit, e.g. in manufacturing a CMOS-structure, e.g. in manufacturing a power semiconductor device, e.g. in manufacturing a transistor, e.g. in manufacturing a photo sensor, and for example in manufacturing a micro electromechanical system. In other words, the electrically insulating structure 106 including one or more hollow chambers 106h may provide a superior isolating structure compared to common buried electrically isolating structures. For example, a second electronic component 108 may be formed at least one of over an in the carrier 102, wherein, once being formed, the electrically insulating structure 106 may be stable during subsequently performed semiconductor processes.

FIG. 5C shows a top view of the processed carrier 102 (along a direction perpendicular to the upper surface 102s of the carrier 102) after the one or more hollow chambers 106h have been formed. According to various embodiments, the top view illustrated in FIG. 5C may correspond to the cross sectional view shown in FIG. 5B. According to various embodiments, the one or more hollow chambers 106h may have a substantially cylindrical shape (one end or both ends of the cylindrical shaped hollow chambers 106h may have a substantially spherical shape due to the processing). According to various embodiments, the electrically insulating structure 106 may include a cavity arrangement including a plurality of substantially cylindrical cavities.

According to various embodiments, the one or more hollow chambers 106h may be completely surrounded by the carrier material, e.g. by silicon, after the annealing process has been carried out to form the one or more hollow chambers 106.

Further, a first trench structure 206t may be formed in the carrier 102, as shown in FIG. 5D. The first trench structure 206t may for example include one or more trenches 206t extending from the upper surface 102s of the carrier 102 into the carrier 102. The first trench structure 206t may be etched into the carrier utilizing for example a patterned mask layer being formed over the annealed carrier 102 and a subsequently performed trench etch process (e.g. reactive ion etching). The first trench structure 206t may adjoin the one or more hollow chambers 106h providing an access to the one or more hollow chambers 106h. In other words, the first trench structure 206t may be configured such that at least one opening may be provided in the one or more hollow chambers 106h, e.g. at least one opening may be provided in each hollow chamber 106h being formed in the carrier 102. As shown in FIG. 5D, the first trench structure 206t may be configured to provide two openings in each hollow chamber 106h being formed in the carrier 102, e.g. a first opening 206o at a first side of a hollow chamber 106h and a second opening 206o at a second side of the hollow chamber 106h opposite to the first side of the hollow chamber 106. According to an embodiment, one or more of the first trench structures 206t may intersect the hollow chamber 106h leaving sections 106h' of the hollow chamber outside the first trench structure 206t. According to a further embodiment, additional trench structures may be formed substantially parallel to the hollow chamber 106h. These additional trench structures 206t may either touch a hollow chamber 106h or may be formed substantially above a hollow chamber 106h. According to an embodiment, the first trench structures 206t may form a substantially ring-shaped or rectangular-shaped first opening 206o.

According to various embodiments, since at least one hollow chamber 106h (or all hollow chambers 106h included in the carrier 102) may have at least one opening 206o (e.g. one or two openings 2060), an access may be provided to the interior of the at least one hollow chamber 106h such that the inner surface of the at least one hollow chamber 106h (or the inner surface of all hollow chambers 106h being formed in the carrier) may be coated with an electrically insulating layer 106s or at least a part of the inner surface region of the at least one hollow chamber 106h may be converted into an electrically insulating layer 106s, e.g. via thermal oxidation. During a thermal oxidation process of a silicon surface region, the silicon oxide is formed from the silicon of the surface region and the provided oxygen, which results in the expansion of the surface layer. Further, the silicon/silicon oxide interface travels deeper into the silicon surface region. Forming a 100 nm $SiO_2$ layer via a thermal oxidation process may consume about 45 nm of the silicon surface region. The electrically insulating layer 106s may be formed in at least one hollow chamber 106h by providing an oxygen flow through the at least one hollow chamber 106h. Therefore, the inner sidewall, e.g. a silicon sidewall, may be oxidized, e.g. via a thermal treatment in addition (a thermal oxidation process). In other words, the electrically insulating layer 106s may be formed in a hollow chamber 106h by providing oxygen in the hollow chamber 106h and thus performing a thermal oxidation of the inner silicon surface of the hollow chamber 106h, e.g. providing a conformally grown silicon oxide layer covering the inner sidewalls of the one or more hollow chambers 106h. Alternatively, according to various embodiments, the electrically insulating layer 106s may be formed using a conformal deposition process, e.g. atomic layer deposition, wherein the electrically insulating material to be deposited may access the hollow chamber 106h through the at least one opening 206o provided in the hollow chamber 106h by the first recess structure 206t.

FIG. 5E shows a schematic cross sectional view of a plurality of hollow chambers 106h being formed in the carrier 102, wherein the inner sidewalls of each hollow chamber of the plurality of hollow chambers 106h may be covered (e.g. conformally covered) with an electrically insulating layer 106s. If the electrically insulating layer 106s may be grown for example by a thermal oxidation process, e.g. silicon oxide may be grown via rapid thermal oxidation (RTO) of silicon or by a conventional furnace process (using the conventional furnace process may reduce the mechanical stress or strain introduced into the material), the electrically insulating layer 106s of respectively adjacent hollow chambers 106h may be connected to each other, which may depend on the distance between the respectively adjacent hollow chambers 106h and the thickness of the electrically insulating layer 106s. Illustratively, the inner surface region of the one or more hollow chambers 106h may be transformed into silicon oxide via a thermal oxidation process. Therefore, according to various embodiments, the electrically insulating layer 106s may enhance the electrically insulating properties of the electrically insulating structure 106 including the one or more hollow chambers 106h. Further, the thickness of the electrically insulating layer 106s may influence the electrically insulating properties of the electrically insulating structure 106 or the electrically insulating properties of the electrically insulating structure 106 may be adapted by adapting the thickness of the electrically insulating layer 106s. To provide a complete vertical insulation between the carrier 102 and the isolated region 102i the semiconductor ridge between each two adjacent hollow chambers 106h can be removed.

According to various embodiments, the removal of the semiconductor material may be performed for silicon by a thermal oxidation, wherein silicon is converted into silicon dioxide. As stated before, to achieve a thermally grown $SiO_2$ layer with a thickness d, Si of about 45% of the thickness d may be converted into $SiO_2$. Since a thermal oxidation of the hollow chambers may occur substantially isotropically, the silicon ridge between each two hollow chambers 106h may be equally converted into silicon oxide from both sides. When all silicon material at a certain location of the ridge is converted into silicon dioxide, the oxidation process at this location ceases while at other positions of the ridge or the hollow chamber 106h the oxidation process may continue as long as sufficient high temperature and oxygen are provided in the furnace process. As a consequence, the thickness 506d of the semiconductor ridge converted into insulating material may be at a maximum twice the thickness of the insulating material 106s or less.

As shown in FIG. 5F, according to various embodiments, the first trench structure 206t may surround or may at least partially surround the one or more hollow chambers 106h formed in the carrier 102, wherein FIG. 5G illustrates a corresponding schematic cross sectional view of the carrier 102 shown in FIG. 5F. Referring to this, the first trench structure 206t and the electrically insulating structure 106 including one or more hollow chambers 106h may be configured to provide an isolated region 102i in the carrier, wherein the first trench structure 206t may provide the lateral electrical isolation and the electrically insulating structure 106 including one or more hollow chambers 106h may provide the vertical electrically isolation. Therefore, the sidewalls of the first trench structure 206t may be covered with or be converted into an electrically insulating material, e.g. if the carrier 102 may be a silicon substrate, a silicon wafer, or a carrier including silicon, the sidewalls of the first trench structure 206t may be covered with silicon oxide. The sidewalls of the first trench structure 206t may be coated with an oxide layer using a thermal oxidation process or a rapid thermal oxidation process (RTO) or another conformal deposition process, e.g. atomic layer deposition.

According to various embodiments, the first trench structure 206t may be arranged laterally within the hollow chamber arrangement including the hollow chambers 106h, as shown in FIG. 5F. This may allow an easier positioning of the first trench structure 206t during manufacturing.

As illustrated in FIG. 5G, the sidewalls of the first trench structure 206t and the inner sidewalls of the one or more hollow chambers 106h may be covered with an oxide in the very same deposition process. This may allow to perform a cost-efficient and time efficient process for manufacturing an isolated region 102i in a carrier 102 (or e.g. for manufacturing a buried electrically insulating structure 106). Further, according to various embodiments, one or more processes and features described referring to the FIGS. 5A to 5G may be included in or may represent a method for processing a carrier, e.g. a method for providing one or more hollow chambers 106h in a carrier 102, e.g. a method for forming a buried electrically insulating structure 106. The processes and features described referring to the FIGS. 5A to 5G may be a part of a method 400 for manufacturing an electronic device 100; e.g. the processes and features described referring to the FIGS. 5A to 5G may include providing a carrier including a hollow chamber structure within the carrier and forming a first trench structure extending from a surface of the carrier to the at least one hollow chamber structure such that an electrically isolated region is formed over the hollow chamber structure.

Referring to this, a second trench structure 208t may be formed in the same way and for example in the same or a similar process as described before for the first trench structure (206t), e.g. utilizing a patterned mask layer exposing surface regions on the upper surface 102s of the carrier 102 for etching the trench structures 206t, 208t. Therefore, the second trench structure 208t may be covered with an electrically insulating material 208s, e.g. by using a thermal oxidation process and/or using e. g. a chemical vapor deposition process or for example an atomic layer deposition process.

According to various embodiments, FIG. 5H illustrates a schematic flow diagram of the method 500 for processing a carrier or a method for providing a plurality of hollow chambers in a carrier. FIG. 5H illustrates a schematic flow diagram of providing a carrier 102 including a hollow chamber structure within the carrier 102 (the hollow chamber structure including for example one or more hollow chambers 106); and forming a first trench structure 206t extending from a surface 102s of the carrier 102 to the at least one hollow chamber structure 106 such that an electrically isolated region 102i is formed over the hollow chamber structure. The method 500 may include: in S510, providing a carrier 102, the carrier 102 including an initial recess structure 502r; in S520, annealing the initial recess structure 502r such that one or more hollow chambers 106h may be formed within the carrier 102 (the one or more hollow chambers 106h may form an (buried) electrically insulating structure 106 in the carrier 102); in S530, forming a first trench structure 206t in the carrier (e.g. forming an (electrically) isolated region 102i in the carrier 102); and, in S540, forming an electrically insulating layer, e.g. an oxide layer, over the inner sidewall of the one or more hollow chambers 106h and/or over the sidewalls of the first trench structure 206t.

Further, the one or more hollow chambers 106h and/or first trench structure 206t may be filled with an electrically conductive material 206m to provide for example an electrode structure in the electrically insulating structure 106 and/or in the first trench structure 206t, as described before.

FIG. 6A shows a schematic view of an electronic device 600, according to various embodiments; the features, functionalities, and processes described before may be included in the electronic device 600 and/or in a method for manufacturing the electronic device 600 or, as described in the following, may be included in a modified way.

According to various embodiments, the electronic device 600 may include: a carrier 102; an electronic vertical component 108 including a surface region 602s and a charge carrier drift region 602d vertically next to the surface region 602s (e.g. the drift region 602d may be arranged below the surface region 602s), the surface region 602s may include a p-n-junction (e.g. the surface region 602s may include at least a first part of the surface region 602s including a semiconductor material doped with a first type of charge carries, and a second part of the surface region 602s may include a semiconductor material doped with a second type of charge carries, opposite the first type of charge carries); an electrically insulating structure 606 formed in the electronic vertical component 108, the electrically insulating structure 606 forming an electrically separated region 102i; a first electronic component 104 being arranged in the electrically separated region 102i; wherein the electrically insulating structure 606 may include one or more chambers 106h (e.g. hollow chambers 106h) in the carrier 102 such that the first electronic component 104 may be electrically separated from the electronic vertical component 108.

The electronic device 600 may include an electronic vertical component 108, for example a vertical transistor (e.g. a vertical power MOSFET, e.g. a vertical power IGBT, e.g. a vertical thyristor, and the like), wherein a first electronic component 104 may be integrated into the electronic vertical component 108; the first electronic component 104 may be disposed in a controlled operating environment 102i within the carrier 102. The electrically isolating structure 606 (e.g. the joint electrically isolating structure), illustrated in FIG. 6A, may include an electrically insulating structure 106 and a first trench structure 206t, as already described. Referring to this, at least one first trench structure 206t may be formed in the carrier 102 extending from the upper surface 102s of the carrier 102, the at least one first trench structure 206t may be configured to electrically (and/or thermally) separate the first electronic component 104 from the electronic vertical component 108.

As shown in FIG. 6A, the electrically insulating structure 606 may be formed in the surface region 602s of the electronic vertical component 108 such that the first electronic component 104 is at least partially electrically separated from the surface region 602s of the electronic vertical component.

According to various embodiments, the electrically isolating structure 606, e.g. including the first trench structure 206t and one or more hollow chambers 106h, may be configured as already described before. The first electronic component 104 may be configured as already described before.

According to various embodiments, the carrier 102 may be a silicon wafer or a silicon substrate including one or more (e.g. a plurality of) doped regions.

Figure 6B:
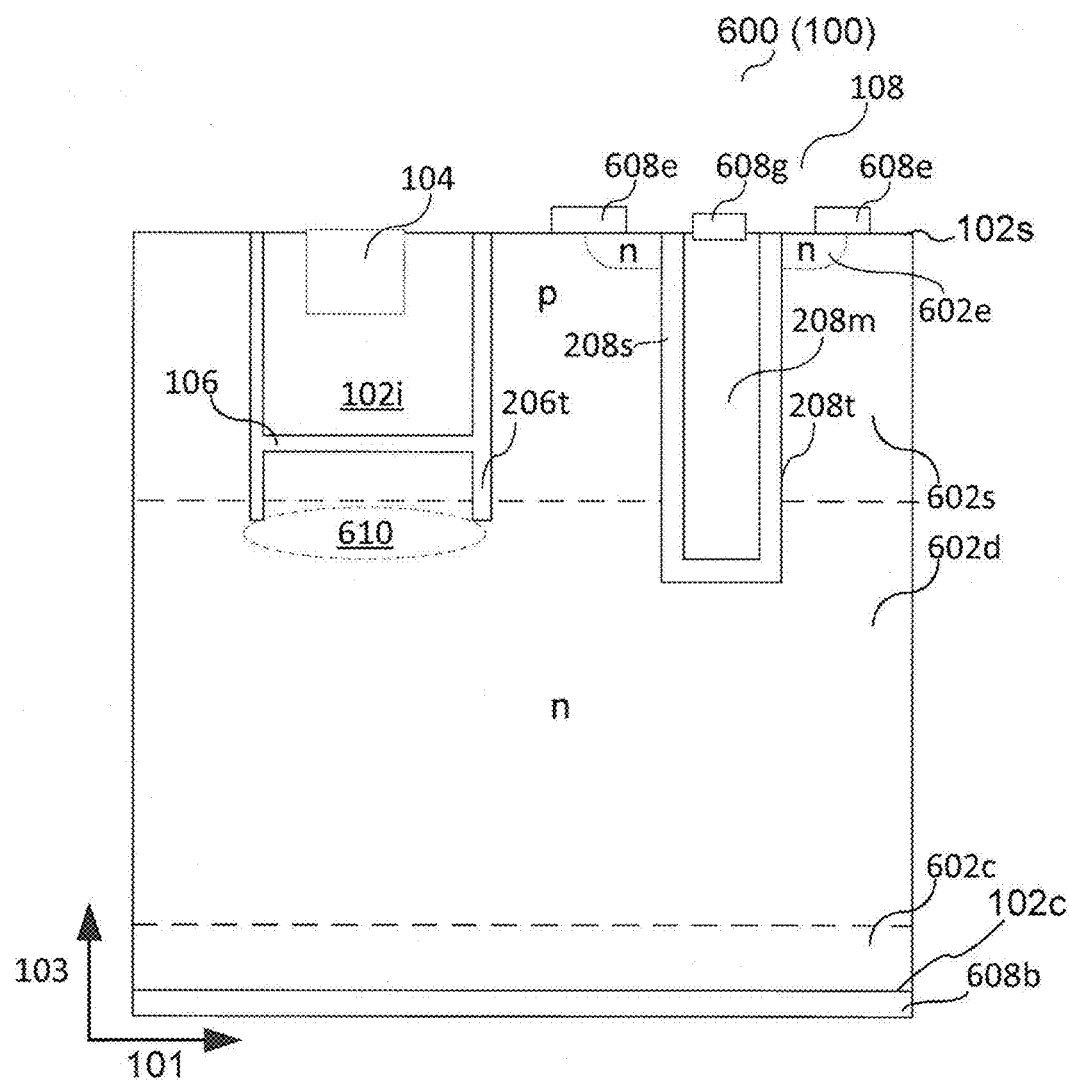
Figure 6C:
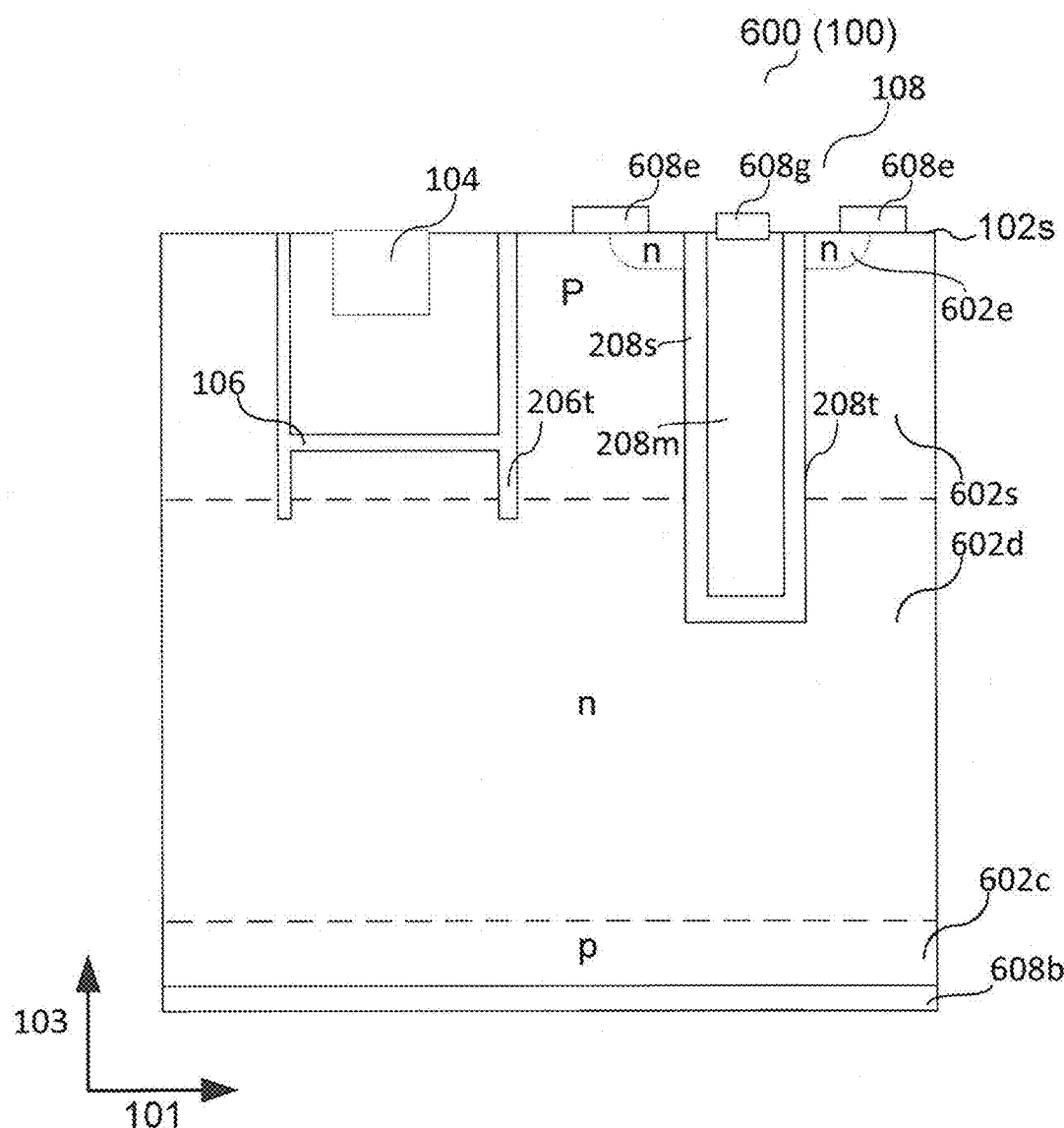

As illustrated in FIG. 6B, the electronic device 600 may be configured as a vertical transistor, e.g. a vertical power MOSFET, e.g. a vertical power IGBT, e.g. a vertical trench gate transistor (a vertical field-effect transistor being operated by a trench gate, a MOSFET, or an IGBT). As described before referring to FIG. 6A, a first electronic component 104 may be arranged within the carrier 102, for example in the electrically isolated region 102i.

The electronic device 600 may include an electronic vertical component 108 or the electronic device 600 itself may be configured as electronic vertical device 600. Referring to this, one or more emitter electrodes 608e in case of an IGBT or source electrodes 608e in case of a MOSFET may be arranged on the upper surface 102s of the carrier 102, the one or more emitter electrodes 608e may adjoin (e.g. being electrically conductively connected to) one or more emitter regions 602e or source regions 602e being arranged in the surface region 602s of the carrier 102. Since the surface region 602s may be for example p-type doped and the one or more emitter regions 602e may be for example n-type doped, the surface region 602s may include a p-n-junction. The drift region 602d of the carrier 102 may be n-type doped, wherein a collector electrode 608b or drain electrode 608b may be arranged at the bottom surface 102c of the carrier 102, the collector electrode 608b may adjoin (e.g. being electrically conductively connected to) the drift region 602d. In case of a MOSFET, the connection may be performed via a contact region 602c or drain region 602c of the same doping type as the emitter region 602e leading to an ohmic connection between the collector electrode 608b and the drift region 602d. In case of an IGBT, the connection may be performed via a contact region 602c or collector region 602c of the complementary doping type of the emitter region 602e leading to an pn-junction between the drift region 602d and the contact region 602c which is operated in forward characteristic when the IGBT device is in a conducting mode. The electronic vertical component 108 or the electronic vertical device 600 may be configured to provide the current flow from the upper surface 102s to the bottom surface 102c of the carrier 102 or from the bottom surface 102c to the upper surface 102s surface 102c of the carrier 102. The type of doping of the doped regions included in the electronic vertical component 108 or the electronic vertical device 600 may be of course opposite to the type of doping illustrated in FIG. 6B.

According to various embodiments, the electronic vertical component 108 or the electronic vertical device 600 may include at least one second trench structure 208t, as already described. The at least one second trench structure 208t may include a trench 208t being filled with an electrically conductive material 208m, wherein the electrically conductive material 208m may be electrically separated from the carrier (e.g. from the surface region 602s and the drift region 602d) by an electrically insulating layer 208s being formed in the trench 208t between the carrier material and the electrically conductive material 208m, as already described referring to FIGS. 2D and 2E. The second trench structure 208t may be configured as a trench gate, wherein for example a gate electrode 608g may be electrically conductively connected to the electrically conductive material 208m being arranged within the isolated trench 208t. The vertical current flow between the upper surface 102s and the bottom surface 102c of the carrier, or e.g. between the one or more emitter electrodes 608e (or emitter regions 602e) and the bottom electrode (e.g. the collector electrode 608b) may be controlled by applying a voltage at the gate electrode 608g, as usual in semiconductor transistor technology.

According to various embodiments, the first electronic component 104 being arranged in the electrically isolated region 102i may include for example a logic circuit controlling the vertical current flow by controlling the voltage (and/or current) being applied at the gate electrode 608g. The first electronic component 104 may further include one or more sensors, one or more measurement circuits, and the like, gathering information (e.g. temperatures, voltages, currents, and the like) of the operating state of the electronic vertical component 108 or the electronic vertical device 600.

As illustrated in FIG. 6B, according to various embodiments, the electrically insulating structure 106 may be arranged in a first depth below the surface 102s of the carrier 102, wherein the trenches of the first trench structure 206t and the second trench structure 208t may have a larger depth. Therefore, the size of the electrically isolated region 102i may be adapted independently from the lateral current separation due to the first trench structure 206t. In other words, the first trench structure 206t may have a depth which may be for example adapted to the depth as desired for the second trench structure 208t, wherein the electrically insulating structure 106 may be arranged in a desired depth below the surface 102s of the carrier 102 changing the size of the electrically isolated region 102i. This may for example allow forming the first and the second trench structure 206t, 208t in the very same process while the electrically isolated region 102i may be formed having the desired shape, position, and/or size.

According to various embodiments, at least a part of the electrically insulating structure 606 may be formed in the drift region 602d of the electronic vertical component 108 such that the first electronic component 104 may be at least partially electrically separated from the drift region 602d of the electronic vertical component.

According to various embodiments, an additional doped region 610 may be formed below the insulating structure 106. The doping inserted below the insulating structure 106 may be of the same type as the surface region 602s and may be in electrical contact with the doping of the surface region 602s and thus in electrical contact to the emitter electrode 608e. The doping 610 inserted below the insulating structure 106 may assist to reduce signal injection into the first electronic component 104.

According to various embodiments, the method for manufacturing an electronic device 100, as described herein, may allow forming an electronic device 100, 600 with an enhanced design, since the depth of the first trench structure 206t, the depth of the second trench structure 208t, and the position, size, and shape of the electrically insulating structure 106 may be adapted respectively to the desired electronic and thermal properties. Referring to this, the one or more hollow chambers 106h may be utilized to thermally separate the isolated region 102i, since a hollow structure may include a reduced thermal conductivity, due to absence of the possibility of thermal conduction via a material. Further, the one or more hollow chambers 106h may be utilized to electrically separate the isolated region 102i, since a hollow structure may include a reduced electrical conductivity, wherein this may be enhanced by oxidizing the inner sidewalls of the one or more hollow chambers 106h such that the electrically isolating structure 106 may be free of electrically conducting and/or electrically semiconducting material, e.g. the regions between adjacent hollow chambers 106h may include an electrically insulating material.

According to various embodiments, the carrier 102 may include an emitter region 602e, a surface region 602s (e.g. a body region 602s), and a drift region 602d being configured to provide at least one of a vertical metal oxide semiconductor field-effect transistor and a vertical insulated-gate bipolar transistor.

To provide a p-n-p junction or an n-p-n junction, e.g. to provide the functionality of a vertical IGBT, the electronic vertical component 108 or the electronic vertical device 600 may further include a collector region 602c, e.g. a p-type bottom emitter region 602c at the bottom of the carrier 102.

Referring to this, the bottom electrode 608b may adjoin (e.g. being electrically conductively connected to) the collector region 602c.

According to various embodiments, the electronic device 100, 600 may be configured such that the electrically insulating structure 106 may not prevent and/or affect the vertical current flow through the electronic component 108.

Figure 6D:
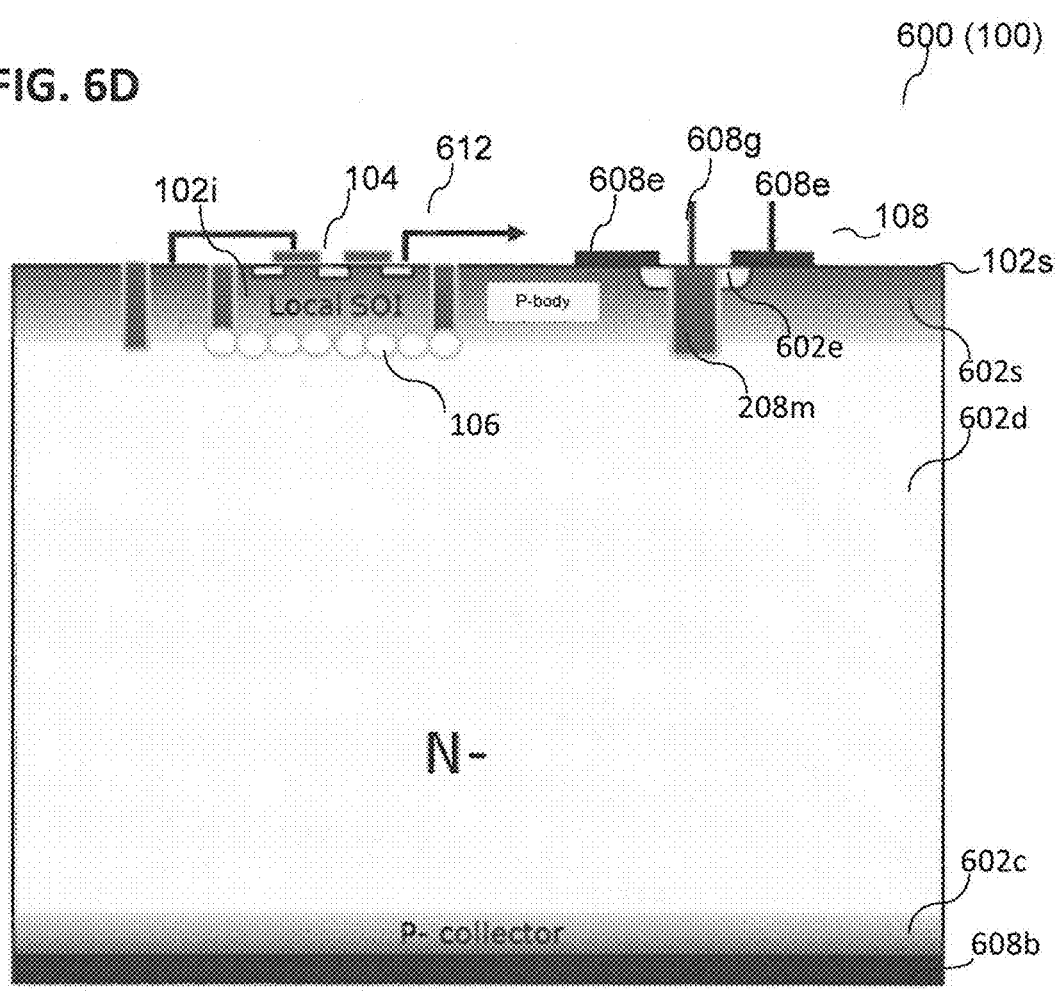

As illustrated in a different schematic view in FIG. 6D, according to various embodiments, the first electronic component 104 may be electrically conductively coupled with the electronic vertical component (e.g. with the gate electrode of the electronic vertical component 108) via a metallization structure 612 being arranged over the carrier 102. Further, according to various embodiments, the first electronic component 104 may be additionally electrically conductively connected to the surface region 602s of the carrier 602 via the metallization structure, e.g. for supporting the first electronic component 104 with a current and/or a voltage. Further, according to various embodiments, the metallization structure 612 may include a wiring and/or contact pads to enable the electronic readout of the data obtained from the first electronic component 104 or to provide a communication between the first electronic component 104 and the environment.

FIG. 7 illustrates a schematic flow diagram of a method 700 for processing a carrier. According to various embodiments, FIG. 7 illustrates a schematic flow diagram of providing a carrier 102 including a hollow chamber structure 106 within the carrier (the hollow chamber structure including for example one or more hollow chambers 106h); and forming a first trench structure 206t in the carrier 102, wherein the first trench structure 206t may extend (e.g. vertically) from the surface 102s of the carrier 102 to the at least one hollow chamber structure 106 such that an electrically and/or thermally isolated region 102i may be provided over the hollow chamber structure 106 in the carrier 102. The method 700 of processing a carrier may include: in S710, forming a porous structure 806 in a first region of the carrier 102, the porous structure 806 including a plurality of hollow chambers 106h (e.g. a plurality of pores 106h in the carrier material of the carrier 102); in S720, forming a layer 802 over the carrier 102, the layer covering the porous structure 806; in S730, forming a trench structure 806t into the layer 802, the trench structure 806t exposing at least a part of the porous structure 806; and, in S740, performing a heat treatment in an oxygen containing atmosphere such that the porous structure 806 is oxidized. Thereby, the sidewalls of the hollow chambers 106h of the porous structure 806 may be covered with an electrically insulating oxide layer or may be at least partially converted into an electrically insulating oxide layer. Further, the sidewalls of the trench structure 806t may be covered with an electrically insulating oxide layer or may be at least partially converted into an electrically insulating oxide layer.

According to various embodiments, method 700 may be included in the method 400 for manufacturing an electronic device, as described herein, e.g. method 700 may be used for forming a (buried) electrically insulating structure in the carrier, e.g. method 700 may be used for providing a substrate 102 including a hollow chamber structure 806 within the substrate 102 and/or for forming a first trench structure 806t extending from a surface 102s of the substrate 102 to the at least one hollow chamber structure 806 such that an isolated region 102i may be formed over the hollow chamber structure 806.

According to various embodiments, method 700 for processing a carrier may further include forming an additional layer (e.g. a field stop layer) disposed between the one or more hollow chambers 106h of the porous structure 806 and the surface layer 802 being formed over the carrier 102, the additional field stop layer may for example include a doped semiconductor material.

Figure 8A:
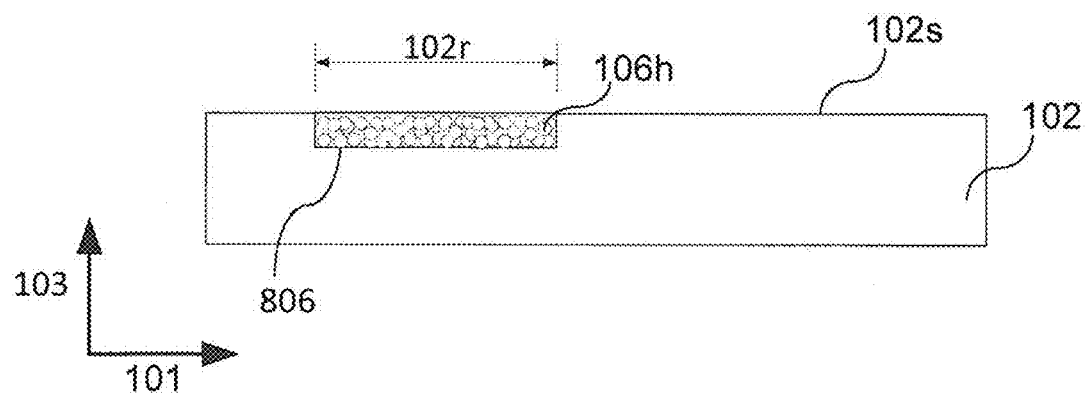
FIGS. 8A to 8D show respectively a schematic view of a carrier at various processing stages during manufacture of an electronic device, according to various embodiments.

FIGS. 8A to 8D show respectively a schematic view of a carrier 102 at various processing stages of method 700. According to various embodiments, FIG. 8A shows a carrier after process S710 of method 700 has been carried out, e.g. after forming a porous structure 806 in a carrier 102, the porous structure 806 including a plurality of pores 106h (hollow chambers 106h, e.g. voids being surrounded by carrier material of the carrier 102). In analogy to the foregoing description, the porous structure 806 may be regarded as an electrically insulating structure 106 providing the same or similar functionalities as already described. Further, the plurality of pores 106h included in the porous structure 806 may be regarded as a plurality of hollow chambers 106h, providing the same or similar functionalities as already described. According to various embodiments, method 700 may be used alternatively to and/or in combination with method 500 for providing an electrically and/or thermally isolated region 102i in the carrier 102, as already described, wherein methods 500 and 700 may be included in method 400 for manufacturing an electronic device and/or may be included (or included in a modified manner) in method 400 for manufacturing an electronic device 100, 600, as described herein.

The porous structure 806 may be formed by processing a selected region 102r of the carrier 102, wherein the carrier 102 may be for example a silicon substrate. The selected region 102r may be defined (or region 102r of the carrier 102 may be selected) by applying a mask material layer and patterning the mask material layer subsequently, such that a selected region 102r of the carrier 102 may be exposed. In other words, the selected region 102r may be defined by a patterned mask layer being arranged over the upper surface 102s of the carrier 102.

The selected region 102r may be subsequently subjected to a physical and/or chemical treatment (e.g. a pore formation treatment) to provide a porous structure 806 in a defined region 102r of the carrier 102. As described herein, the term "porosity" or related terms like "porous" structure, and the like, may be defined as the fraction of void within the material. For example, porous silicon may be divided into three categories based on the size of the pores included in the silicon: firstly, macro-porous silicon including pores having a diameter smaller than about 2 nm, secondly, meso-porous silicon including pores having a diameter in the range from about 2 nm to about 50 nm, and, thirdly, micro-porous silicon including pores having a diameter larger than about 50 nm.

Therefore, forming a porous structure 806 in a first region of the carrier 102 may include partially treating a silicon substrate 102 such that at least one region is formed in the silicon substrate 102, the at least one region including at least one of macro-porous silicon, meso-porous silicon, and micro-porous silicon. According to various embodiments, forming a porous structure 806 in a first region of the carrier 102 may include introducing a plurality of pores 106h into the silicon substrate 102, the plurality of pores 106h forming a porous structure 806 in a first region of the carrier 102, e.g. by using an anodization process (e.g. performed in an anodization cell). An anodization cell may for example include a platinum cathode and a silicon carrier 102 being configured as anode in presence of an electrolyte, e.g. hydrogen fluoride ($HF_{aq}$) electrolyte. Thereby, the corrosion of the silicon substrate may be generated by applying a voltage between the platinum cathode and the silicon substrate and running electrical current through the anodization cell.

According to various embodiments, forming a porous silicon region in the carrier 102 by utilizing an anodization process may enable to generate a porosity of porous silicon in the range from about 5% to about 90%. Further, the electrolyte being used in the anodization cell may include ethanol.

Further, according to various embodiments, forming a porous structure 806 in a first region of the carrier 102 may include introducing a plurality of pores 106h into the silicon substrate 102, the plurality of pores 106h forming a porous structure 806 in a first region of the carrier 102, e.g. by using stain etching or a so-called stain etch process.

A stain etch process may include performing a wet etch process using a stain-etchant, e.g. at least one of hydrofluoric acid, nitric acid and water, e.g. an etchant including hydrofluoric acid, nitric acid and water (e.g. a diluted solution of nitric acid in concentrated hydrofluoric acid). According to various embodiments, a porous silicon structure 806 may be formed by stain-etching, e.g. by subjecting an exposed region 102r of the silicon substrate 102 to a wet etchant including nitric acid ($HNO_3$) and hydrogen fluoride (HF).

Figure 8B:
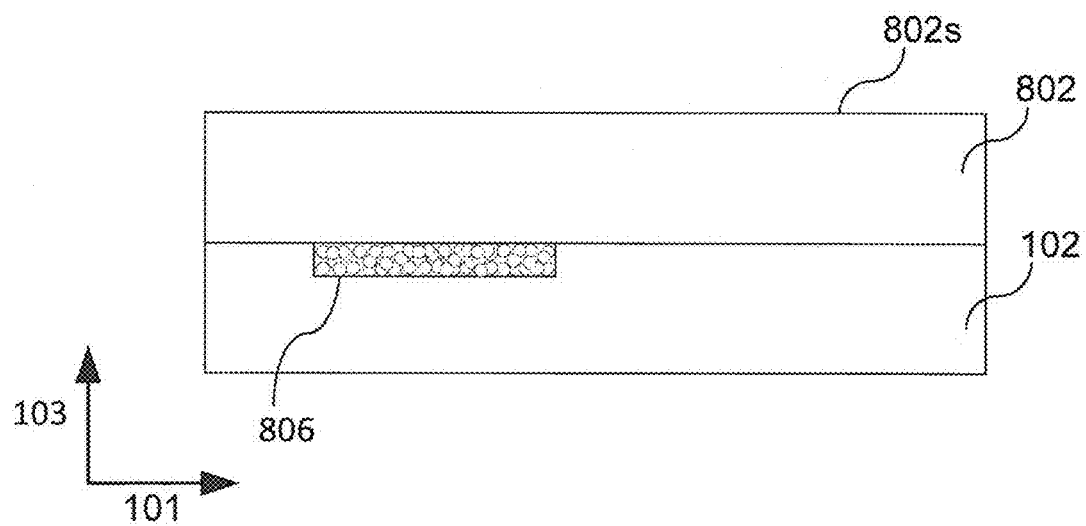

After one or more porous structures 806 have been formed in the carrier 102, as shown in FIG. 8A, a layer 802 may be formed over the surface 102s of the carrier 102; the layer 802 may cover the porous structure 806 partially or completely. According to various embodiments, the layer 802 being formed over the surface of the carrier 102 may include silicon, wherein the carrier 102 may include silicon as well, therefore, a buried porous structure 806 (electrically insulating structure 106) may be formed within the carrier 102, 802, the porous structure 806 including one or more (e.g. a plurality of) hollow chambers 106h, as illustrated in FIG. 8B. As described in the following, the porous structure 806 may be oxidized in a subsequently performed process (in process S740), such that an epitaxial silicon layer 802 may be deposited over the silicon substrate and over the porous silicon structure 806 before the porous structure 806 is oxidized. Illustratively, the crystallographic information enabling a homoepitaxial growth of a silicon layer 802 over the porous silicon structure 806 may be transferred through the porous structure 806 (e.g. by the sidewalls of the pores 106h or the remaining silicon surrounding the pores 106h), which may be disturbed or which may be not possible if the porous silicon structure 806 is oxidized before the silicon layer 802 is grown. If for example the sidewalls of the pores 106h may include silicon oxide or may be covered with a silicon oxide layer, the transfer of the crystallographic information to the silicon layer 802 being deposited over the plurality of pores 106h may be suppressed. Understandably, the masking material being used before to define the selected regions 102r of the carrier 102 for forming the one or more porous structures 806 may be removed before the layer 802 may be formed over the carrier 102.

According to various embodiments, the layer 802 may be formed or deposited using a layering process, e.g. LPCVD, as already described.

According to various embodiments, the porous structure 806 (or the sidewalls of the pores 106h of the porous structure 806) may be oxidized by applying processes S730, and S740 of method 700. Therefore, a trench structure 806t may be formed and/or utilized; the trench structure 806t may include a dielectric material 806s (in analogy to the dielectric layer 106s). The dielectric material 806s may be formed within the trench structure 806t during the oxidation of the porous structure 806, for example via a thermal oxidation process, as described before.

Figure 8C:
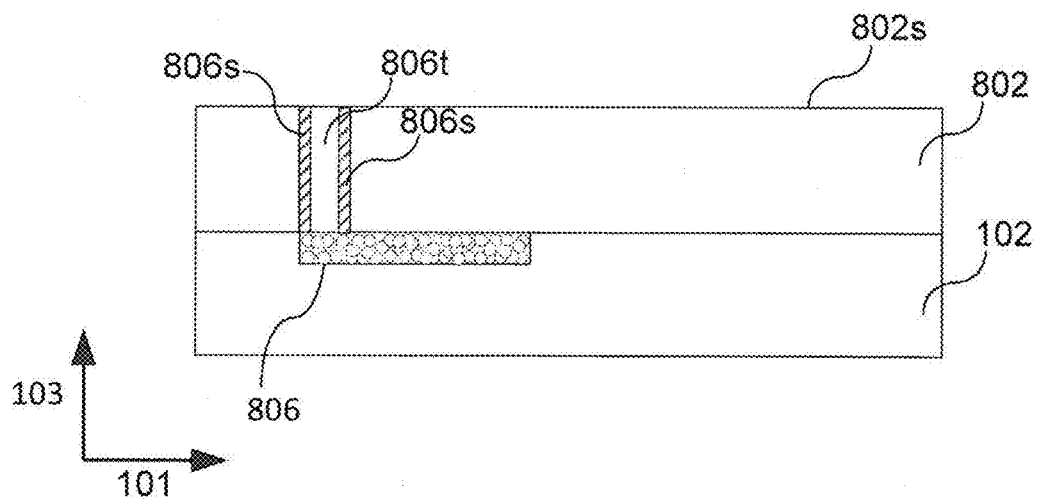

As illustrated in FIG. 8C, the trench structure 806t may include at least one trench 806t extending from the surface 802s of the layer 802 to at least the porous structure 806, or extending for example vertically into the layer 802 and/or into the carrier 102. The trench structure 806t may be configured and may have the functionality as the first trench structure 206t, as described before. Referring to this, the trench structure 806t may be a first trench structure formed in the carrier 102. The trench structure 806t may include one or more trenches 806t, wherein at least one sidewall of the one or more trenches 806t may be covered with or may be converted into an electrically insulating layer 806s, e.g. silicon oxide. As already described, the one or more trenches 806t of the trench structure 806t may be formed by applying a layering process to form a mask layer, subsequently applying a patterning process to pattern the mask layer, and subsequently applying an etch process to form the one or more trenches 806t having a desired depths. The electrically insulating layer 806s may be formed during a thermal oxidation process, wherein the thermal oxidation process may be applied to completely or at least partially oxidize the porous structure 806. According to various embodiments, the electrically insulating oxide 806s may be a sidewall oxide layer. According to various embodiments, the electrically insulating layer 806s may have a thickness in the range from about 50 nm to about 200 nm (e.g. the same thickness as needed for the gate oxide 208s, as described before). Performing a thermal oxidation process may allow oxidizing the pores of the porous structure 806 completely (or at least partially). According to various embodiments, the porous structure 806 may have a porosity larger than about 55% to be completely oxidized via a thermal oxidation process. According to various embodiments, the porous structure 806 may be at least partially converted into an electrically insulating layer 806s containing voids filled for example with a gaseous atmosphere, e.g. an atmosphere containing at least one of oxygen, nitrogen, argon or the like.

According to various embodiments, a heat treatment may be carried out (e.g. in process S740 of method 700), e.g. a thermal annealing in oxygen or a thermal oxidation process such that the porous structure 806 may be oxidized. Thereby, according to various embodiments, the sidewalls of the pores 106h of the porous structure 806 may be covered with an electrically insulating oxide layer 106s; or an electrically insulating oxide layer 106s may be formed over the inner sidewalls of the pores 106h of the porous structure 806. Illustratively, the silicon of the porous structure 806 may be at least partially (e.g. completely) converted into silicon oxide, as described before.

Performing method 700 may generate an electrically insulating structure 106, as described before referring to the electronic device 100 or the electronic vertical device 600. According to various embodiments, method 700 may further include additional processes used in semiconductor industry being known for realizing the described structures, e.g. additional layering process, patterning process, doping processes, heat treatments, cleaning processes, and the like. According to various embodiments, the surface layer 802 being formed over the carrier 102 may include doped silicon, or the surface layer 802 may be doped using an additional doping process (e.g. ion implantation and/or doping by thermal diffusion of dopant material into the layer 802).

Figure 8D:
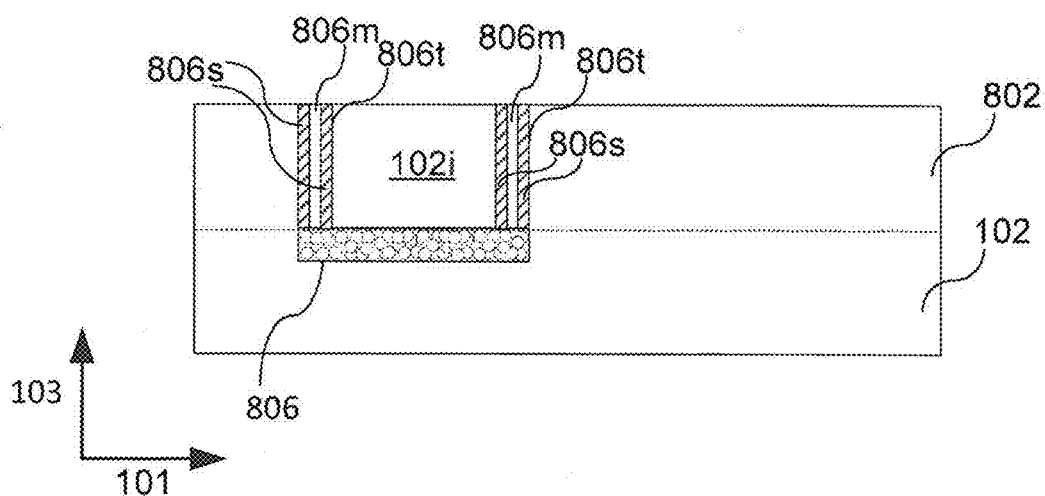

As illustrated in FIG. 8D, method 700 may be used to provide an isolated (e.g. electrically isolated) region 102i in the carrier 102, the isolated region 102i may be vertically separated from the carrier 102 by the porous structure 806 and laterally isolated from the carrier 102 by the trench structure 806t adjoining the porous structure 806, wherein the porous structure 806 and/or the trench structure 806t may include an electrically insulating material, e.g. covering the inner sidewalls (or surfaces) of the plurality of pores 106h of the porous structure 806 and/or the inner sidewalls (or surfaces) of the one or more trenches 806t included in the trench structure 806t. Further, as already described, a first electronic component 104 may be formed in the isolated region 102i in the carrier 102 and a second electronic component 108 may be formed in a region of the carrier 102 outside the isolated region 102i, e.g. in a region of the carrier 102 being free of the porous structure 806. Alternatively, as already described, a first electronic component 104 may be formed at least partially in the isolated region 102i of the carrier 102 and the second electronic component 108 may be configured as an electronic vertical component 108 (or the electronic device 100 may be configured as an electronic vertical device 600), wherein the electronic vertical component 108 may be formed in a region of the carrier 102 outside the isolated region 102i, e.g. in a region of the carrier 102 being free of the porous structure 806 or in a region being laterally next to the porous structure 806. Further, as already described, the one or more trenches 806t of the trench structure 806t may be filled with an electrically conductive material 806m, as shown in FIG. 8D.

As described referring to FIGS. 8A to 8D, the size of the pores 106h (the hollow chambers in the porous structure 806) may be controlled during processing the carrier 102 to form the porous structure 806 and/or during a subsequently performed thermal treatment, e.g. by adding hydrogen. Further, the pores 106h of the porous structure 806 may grow together during a thermal treatment, such that a single hollow chamber 106h may be formed, wherein the inner sidewall of the single hollow chamber 106h may be covered with an oxide, cf. FIG. 1D. According to various embodiments, using method 700 may allow forming an electrically insulating structure 106 as described referring to FIGS. 2A to 2E and FIGS. 6A to 6D.

According to various embodiments, as described herein, an electronic device 100, 600 may be provided and a method 400 for manufacturing an electronic device 100, 600 may be provided, the method 400 may include for example one of method 500 and method 700.

According to various embodiments, an electronic device 100, 600 (e.g. a transistor) may be provided being internally controlled, which means that the electronic device 100, 600 may not be monitored via external connections of the electronic device 100, 600, e.g. a control circuit 104, a logic circuit 104, a measurement circuit 104, a sensor 104, and the like, may be integrated into the electronic device 100, 600. Therefore, an enhanced monitoring of the electronic device 100, 600 may be provided, wherein the internal states (temperature, voltage, current, electrical potentials, and the like) of the electronic device 100, 600 may be accessible, wherein a signal propagation delay may be prevented or a signal propagation time may be enhanced, such that for example the response time may be enhanced. Further, according to various embodiments, electrical signal injections from the circuit environment 108 into the monitoring and/or controlling circuit 104 may be reduced and/or prevented due to the electrically insulating structure 106, 806 and/or the trench structure 206t, 806t providing an isolated region 102i for the monitoring and/or controlling circuit 104; and therefore, the response time of the monitoring and/or controlling of the electronic device 100, 600 via the monitoring and/or controlling circuit 104 may be enhanced or additional time delays for correcting influences form signal injections into the monitoring and/or controlling circuit 104 may not be necessary.

Further, during processing the electronic device 100, 600, as described herein, forming a first trench structure 206t, 806t to provide an isolated region 102i in the carrier 102 and forming a second trench structure 208t to provide a control gate of a transistor (e.g. the control gate of a vertical transistor, e.g. the control gate of a vertical IGBT, a gate of a capacitor, or any other trench structure used in electronic devices) may be carried out in a single process, which may allow a cost efficient and/or time efficient manufacturing of an electronic device 100, 600.

Illustratively, an electronic device 100, 600 and a method for manufacturing an electronic device 100, 600 is provided herein, wherein a locally limited (laterally limited) silicon-on-nothing and/or silicon-on-insulator structure may be disposed and/or manufactured on the same silicon substrate as a vertical gate-structure 208t of an electronic device 100, 600, wherein the gate-structure 208t may be used to control for example the electronic device 100, 600. Thereby, the second electronic component 108 and/or the electronic device 100, 600 may be configured as a junction field-effect transistor (JFET) and/or a power MOSFET (e.g. a super-junction transistor or a transistor using field plate compensation structures) and/or an IGBT.

As already described, the lateral electrical isolation 206t, 206s, 206m of the isolated region 102i in the carrier 102 may be formed at the same time (in the very same process) as the gate structure 208t, 208s, 208m.

According to various embodiments, the lateral electrical isolation 206t, 206s, 206m and the gate structure 208t, 208s, 208m may be filled with polycrystalline silicon.

According to various embodiments, a trench gate electronic device may be provided including a local SOI (silicon on insulator) structure.

As already described, according to various embodiments, the depths of the vertical trench etching may be adapted as desired; however, the trenches may connect to the electrically insulating structure 106 to provide a local SOI structure.

According to various embodiments, one or more local SOI structures 102i may be formed in the carrier 102 or may be integrated into the electronic device 100, 600. The trench structures 206t, 806t, 208t may be partially filled with an electrically insulating material 206s, 208s to enable a lateral electrical isolation, wherein the trench structures 206t, 806t, 208t may be filled with an electrically insulating material 206s, 208s surrounding an electrically conductive material 206m, 208m (e.g. electrode material), the electrically conductive material 206m may also be disposed within the one or more hollow chambers, e.g. at least partially filling the one or more hollow chambers, wherein the electrically conductive material 206m, 208m may be electrically connected to a respective electrical potential (e.g. a fixed electrical potential), e.g. to a source-potential or an emitter-potential of a power transistor 108 or to a control circuit structure, to prevent or reduce the occurrence of parasitic channels. In other words, an electrical voltage and/or an electrical field may be applied via the conductive material 206m being disposed in the first trench structure 206t and/or in the electrically insulating structure 106 to prevent or reduce the occurrence of parasitic channels in the carrier 102.

According to various embodiments, an electronic device may include: a carrier including at least a first region and a second region being laterally adjacent to each other; an electrically insulating structure arranged in the first region of the carrier, wherein the second region of the carrier may be free of the electrically insulating structure; a first electronic component arranged in the first region of the carrier over the electrically insulating structure; a second electronic component arranged in the second region of the carrier; wherein the electrically insulating structure may include one or more hollow chambers, wherein the sidewalls of the one or more hollow chambers may be covered with an electrically insulating material.

According to various embodiments, the second region of the carrier may be free of the electrically insulating structure 106 such that a vertical current flow in the second region of the carrier may not be affected by the electrically insulating structure. According to various embodiments, the second region of the carrier may be laterally next to the electrically insulating structure 106 such that a vertical current flow in the second region of the carrier may not be affected by the electrically insulating structure. According to various embodiments, the second electronic component being arranged in the second region of the carrier may communicate with the first electronic component being arranged in the first region of the carrier.

According to various embodiments, the first electronic component may include a plurality of electronic components; therefore, the first electronic component may also be regarded as and referred to as first electronic structure. According to various embodiments, the second electronic component may include a plurality of electronic components; therefore, the second electronic component may also be regarded as and referred to as second electronic structure.

According to various embodiments, the electrically insulating structure may include at least one first trench structure extending from a surface of the carrier, the at least one first trench structure may electrically separate the first electronic component from the second electronic component (or e.g. the first electronic component from the electronic device), the at least one first trench structure may include at least one sidewall being covered with an electrically insulating material.

According to various embodiments, the electrically insulating structure may be at least partially filled with an electrically conductive material, e.g. with an electrode material to provide a desired electrical potential in the isolated region over the electrically insulating structure.

According to various embodiments, the second electronic component may include at least one second trench structure, the at least one second trench structure may include at least one sidewall being covered with an electrically insulating material. The second trench structure may have for example the same depth, as the first trench structure.

According to various embodiments, the at least one second trench structure may be at least partially filled with an electrically conductive material. Therefore, according to various embodiments, the second trench structure may be a gate electrode controlling a current flow through a vertical transistor. According to various embodiments, the second trench structure may be a gate electrode controlling a current flow through a vertical IGBT. According to various embodiments, the second trench structure may be configured to store an electrical charge (e.g. the second trench structure may include a trench capacitor).

According to various embodiments, the first electronic component may include at least one component of the following group of components, the group including: a transistor, a logic circuit, a low voltage transistor MOSFET, a sensor (e.g. a temperature sensor, a chemical sensor, a pressure sensor, and an acceleration sensor), a micromechanical system, and a measurement circuit.

According to various embodiments, the carrier may include a first surface and a second surface opposite the first surface; wherein the second electronic component may be configured to provide a current flow from the first surface (the upper surface 102s) to the second surface (the bottom surface 102c) of the carrier.

According to various embodiments, the second electronic component may include a vertical transistor configured to provide a current flow from the first surface of the carrier to the second surface of the carrier. According to various embodiments, the vertical transistor may include an emitter region and a gate region arranged in a surface region extending at the upper surface of the carrier, the surface region may be configured as a base region. Further, according to various embodiments, the vertical transistor may include a collector region or a collector electrode arranged in a bottom region extending at the bottom surface of the carrier. Further, according to various embodiments, the vertical transistor may include a drift region being arranged in the carrier between the surface region and the bottom region.

According to various embodiments, the second electronic component may include at least one electronic component of the following group of electronic components, the group including: a transistor, a capacitor, a coil, an antenna, a power transistor, a JFET, a power JFET, a MOSFET, a power MOSFET, an IGBT, a power IGBT, a bipolar transistor, a bipolar power transistor, a driving circuit for an electronic device (e.g. a driving circuit for a display), a thyristor, and a transceiver structure.

According to various embodiments, the second electronic component may be configured as a vertical component including at least one first electrode on the upper surface of the carrier and at least one second electrode on the bottom surface of the carrier, wherein the at least one first electrode and the at least one second electrode may be electrically coupled with each other, e.g. via doped regions in the carrier.

According to various embodiments, the one or more hollow chambers may be at least partially filled with an oxide. According to various embodiments, the one or more hollow chambers may include one or more pores, the one or more pores forming a porous material structure.

According to various embodiments, the first electronic component and the second electronic component may be electrically coupled with each other via a metallization structure being disposed over the carrier.

According to various embodiments, the carrier may be configured to provide at least one of a vertical MOSFET and a vertical IGBT, wherein the carrier may include: a surface layer including a p-n-junction, e.g. the surface layer including a first-type doped base material (first-type doped silicon) and one or more surface emitter regions 602e within the surface layer 602s including a second-type doped emitter material (second-type doped silicon); and further the surface layer including a gate structure 208t, 208m, 208s (e.g. the second trench structure). Further the carrier may include a drift layer 602d disposed below the surface layer 602s, the drift layer 602d may include second-type doped drift layer material (second-type doped silicon).

Further, according to various embodiments, a collector layer 602c may be provided below the drift layer 602d including a first-type doped collector layer material (first-type doped silicon).

According to various embodiments, a p-type doped material may have holes as majority charge carries and an n-type doped material may have electrons as majority charge carries. Without loss of generality a first type of charge carries (e.g. a majority charge carries) may include electrons, and a second type of majority charge carries may be holes; or a first type of charge carries (e.g. a majority charge carries) may be holes, and a second type of majority charge carries may be electrons.

According to various embodiments, a first-type doped material may include a first type of charge carries and a second-type doped material may include a second type of charge carries.

According to various embodiments, a buried electrically insulating structure may be formed within the surface layer.

According to various embodiments, the buried electrically insulating structure may be formed within the drift layer.

According to various embodiments, the buried electrically insulating structure may be formed within the surface layer and the drift layer.

According to various embodiments, the buried electrically insulating structure may be formed below the drift layer.

According to various embodiments, the electronic device or the second electronic component may include: at least one gate electrode disposed on the upper surface of the carrier electrically conductively connected to the gate structure; at least one emitter electrode (source) disposed on the upper surface of the carrier electrically conductively connected to the p-n-junction; and at least one collector electrode (drain) disposed on the bottom surface of the carrier electrically conductively connected to the collector layer (or to the drift layer).

According to various embodiments, an electronic device may include: a carrier; an electronic vertical component including a surface region and a charge carrier drift region vertically next to the surface region, the surface region including a (e.g. at least one) p-n-junction; an electrically insulating structure formed in the electronic vertical component, wherein the electrically insulating structure may form an electrically separated region; a first electronic component arranged in the electrically separated region (e.g. over at least a part of the electrically insulating structure); wherein the electrically insulating structure may include one or more hollow chambers in the carrier such that the first electronic component may be electrically separated (e.g. vertically separated, or vertically electrically isolated) from the electronic vertical component.

According to various embodiments, the electrically insulating structure may be formed in the surface region of the electronic vertical component such that the first electronic component is at least partially electrically separated from the surface region of the electronic vertical component.

According to various embodiments, an electronic device may further include: at least one first trench structure formed in the carrier extending from the upper surface of the carrier, the at least one first trench structure electrically separating (e.g. laterally separating or laterally electrically isolating) the first electronic component from the electronic vertical component.

According to various embodiments, the at least one first trench structure may include at least one sidewall being covered with an electrically insulating material.

According to various embodiments, the at least one first trench structure may be at least partially filled with an electrically conductive material.

According to various embodiments, the electronic vertical component may include at least one second trench structure.

According to various embodiments, the at least one second trench structure may include at least one sidewall being covered with an electrically insulating material.

According to various embodiments, the at least one second trench structure may be at least partially filled with an electrically conductive material.

According to various embodiments, at least a part of the electrically insulating structure may be formed in the drift region of the electronic vertical component such that the first electronic component may be at least partially electrically and/or thermally separated from the drift region of the electronic vertical component.

According to various embodiments, the carrier may be configured to provide at least one of a vertical metal oxide semiconductor field-effect transistor and a vertical insulated-gate bipolar transistor.

According to various embodiments, the electronic vertical component may further include at least one first electrode at the upper surface of the carrier and at least one second electrode at the bottom surface of the carrier, the electrodes being electrically coupled with each other via the surface region and the drift region of the carrier.

According to various embodiments, the first electronic component may be electrically coupled with the electronic vertical component via a metallization structure being arranged over the carrier.

According to various embodiments, a method for manufacturing an electronic device may include: providing a carrier including a hollow chamber structure within the carrier (the hollow chamber structure may include one or more hollow chambers); forming a first trench structure extending from a surface of the carrier to the at least one hollow chamber structure such that an electrically isolated region is formed over the hollow chamber structure; and (e.g. at the same time) forming at least one second trench structure extending from the upper surface of the carrier into a second region of the carrier, the second region of the carrier being laterally adjacent to the electrically isolated region, the second trench structure being at least a part of an electronic component provided in the second region of the carrier.

According to various embodiments, forming at least one first trench structure and forming at least one second trench structure may further include covering at least one sidewall of each trench structure with an electrically insulating material (e.g. with an oxide).

According to various embodiments, forming at least one first trench structure and forming at least one second trench structure may further include at least partially filling the trench structures (the first trench structure and the second trench structure) with an electrically conductive material (e.g. with doped polysilicon).

According to various embodiments, the method for manufacturing an electronic device may further include: forming an additional electrical component in the electrically isolated region, the additional electrical component being separated from the electronic component provided in the second region of the carrier. Referring to this, the additional electrical component may be a first electronic component 104 and the electronic component provided in the second region of the carrier may be a second electronic component 108.

According to various embodiments, the method for manufacturing an electronic device may further include: forming a metallization structure over the carrier, the metallization structure may be configured to electrically connect the electronic component provided in the second region of the carrier with the additional electrical component provided in the electrically isolated region of the carrier.

According to various embodiments, a method for operating an electronic device may include: addressing an electronic vertical component arranged in a region of a carrier via an electronic structure being arranged within the electronic vertical component, the electronic structure may be electrically separated from the electronic vertical component via an electrically insulating structure, the electrically insulating structure may be disposed between the electronic structure and the electronic vertical component; and the electrically insulating structure may include one or more chambers (or hollow chambers), wherein the sidewalls of the one or more chambers are covered with an oxide.

According to various embodiments, a method for operating an electronic device may be configured and/or adapted to operate the electronic device 100, 600, as described herein.

According to various embodiments, an electrically separated region may be electrically isolated or may include an electrically isolated region. According to various embodiments, an electrically isolated region may include a region being surrounded by an electrically insulating (electrically isolating) material, e.g. by a material or structure which may prevent a substantial current flow.

According to various embodiments, the one or more hollow chambers may include one or more pores of a porous material.

According to various embodiments, a hollow chamber structure may include one or more hollow chambers one or more hollow chambers and/or one or more pores of a porous material.

According to various embodiments, the at least one second trench structure and/or the one or more hollow chambers may be at least partially filled with an electrically conductive material, wherein the electrically conductive material may be electrically conductively connected to a predefined potential, e.g. to a part of the second electronic component or to a part of the electronic vertical component (e.g. to at least one source electrode of the electronic vertical component or e.g. to the p-body of the electronic vertical component, as illustrated in FIG. 6D).

According to various embodiments, the electronic device 100, 600 may further include an additional doped region below the electrically insulating structure (as illustrated in FIG. 6B). Further, according to various embodiments, the additional doped region may be electrically conductively connected to the p-type surface region of the electronic vertical component. Further, according to various embodiments, the additional doped region may include the same type of doping, e.g. p-type, than the surface region of the electronic vertical component. According to various embodiments, the additional doped region may include a doping dose, i. e. an integral of the doping concentration on a path in a vertical direction, (dose of the implant material) of larger than about $3*10^{12}$ atoms/cm$^2$ or larger than about $1*10^{13}$ atoms/cm$^2$.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing an electronic device, the method comprising:
    providing a carrier comprising at least a first region and a second region being laterally adjacent to each other;
    forming an electrically insulating structure arranged in the first region of the carrier, wherein the electrically insulating structure comprises one or more hollow chambers and the second region of the carrier is free of the electrically insulating structure, and wherein the sidewalls of the one or more hollow chambers are covered with an electrically insulating material;
    forming a first electronic component in the first region of the carrier over the electrically insulating structure; and
    forming a second electronic component in the second region of the carrier,
    wherein the second electronic component comprises at least one second trench structure, and wherein the at least one second trench structure comprising at least one sidewall being covered with an electrically insulating material, and
    wherein the at least one second trench structure is at least partially filled with an electrically conductive material.

2. The method of claim 1; further comprising
    forming at least one first trench structure in the carrier extending from a surface of the carrier so that the at least one first trench structure electrically separates the first electronic component from the second electronic component, wherein the at least one first trench structure comprises at least one sidewall being covered with an electrically insulating material and is at least partially filled with an electrically conductive material.

3. The method of claim 1,
    wherein the carrier comprises a first surface and a second surface opposite the first surface;
    wherein the second electronic component is configured to provide a current flow between the first surface and the second surface.

4. The method of claim 3,
    wherein the second electronic component comprises a vertical transistor configured to provide the current flow between the first surface and the second surface.

5. The method of claim 1,
    wherein the first electronic component and the second electronic component are electrically coupled with each other via a metallization structure being disposed over the carrier.

* * * * *